(12) United States Patent
Burg et al.

(10) Patent No.: US 9,306,586 B2
(45) Date of Patent: Apr. 5, 2016

(54) METHODS AND DEVICES FOR IMPLEMENTING ALL-DIGITAL PHASE LOCKED LOOP

(71) Applicant: Marvell World Trade Ltd., St. Michael (BB)

(72) Inventors: Olivier Burg, Lausanne (CH); Miguel Kirsch, Conches (CH)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/713,945

(22) Filed: May 15, 2015

(65) Prior Publication Data

US 2015/0249455 A1 Sep. 3, 2015

Related U.S. Application Data

(62) Division of application No. 13/406,342, filed on Feb. 27, 2012, now Pat. No. 9,036,763.

(60) Provisional application No. 61/447,369, filed on Feb. 28, 2011.

(51) Int. Cl.
*H03L 7/197* (2006.01)
*H03L 7/113* (2006.01)
*H03L 7/16* (2006.01)
*H03L 7/099* (2006.01)

(52) U.S. Cl.
CPC ............ *H03L 7/1976* (2013.01); *H03L 7/0991* (2013.01); *H03L 7/113* (2013.01); *H03L 7/16* (2013.01); *H03L 2207/50* (2013.01)

(58) Field of Classification Search
CPC ...................................... H03L 7/1976
USPC ........................................... 375/376
See application file for complete search history.

(56) References Cited

U.S. PATENT DOCUMENTS

| | | | |
|---|---|---|---|
| 7,724,093 B2 | 5/2010 | Wormer et al. | |
| 7,888,973 B1 | 2/2011 | Rezzi et al. | |
| 2002/0191727 A1* | 12/2002 | Staszewski et al. | 375/376 |
| 2008/0315928 A1 | 12/2008 | Waheed et al. | |
| 2008/0317187 A1 | 12/2008 | Waheed et al. | |
| 2009/0302951 A1 | 12/2009 | Ballantyne | |
| 2010/0295590 A1 | 11/2010 | Yoshihara et al. | |
| 2011/0164675 A1* | 7/2011 | Senoue et al. | 375/240.01 |

* cited by examiner

*Primary Examiner* — Michael Neff

(57) ABSTRACT

An all-digital phase locked loop includes a time to digital converter that determines a fractional portion of a phase count. The time to digital converter has a quantization error that may be caused by phase noise, delay errors or skew errors. Several methods and devices may reduce the quantization error. A noise source may add dithering to the reference clock at an input of the time to digital converter. A digital processor may use two successive rising edges of the oscillator signal to count time delays of the time to digital convertor to the reference clock. The digital processor uses these counts to determine a ratio of the time delays and the time period of the oscillator signal for controlling a digitally controlled oscillator. A radio frequency counter circuit detects whether the oscillator signal leads or lags the reference clock because of skew and generates a phase signal to correct the skew.

18 Claims, 26 Drawing Sheets

2500

| TDC output $f_A = \Delta T/T_{osc}$ | estimator E | correction applied to phase acquisition $C+f_A$ |
|---|---|---|
| $0 < f_A < TH$ | 0 | no correction |
| | 1 | +1 |
| $TH < f_A < 1-TH$ | ignored | no correction |
| $1-TH < f_A < 1$ | 0 | -1 |
| | 1 | no correction |

Fig. 25

METHODS AND DEVICES FOR IMPLEMENTING ALL-DIGITAL PHASE LOCKED LOOP

CROSS REFERENCE TO RELATED APPLICATIONS

This application is a division of U.S. patent application Ser. No. 13/406,342, filed Feb. 27, 2012 (now pending), which claims the benefit of U.S. Provisional App. No. 61/447,369 for "Methods and Devices for Implementing All-Digital Phase Locked Loop" filed Feb. 28, 2011, the disclosure of each of which is incorporated herein by reference in their entireties.

BACKGROUND

Particular embodiments generally relate to all-digital phase locked loops.

Unless otherwise indicated herein, the approaches described in this section are not prior art to the claims in this application and are not admitted to be prior art by inclusion in this section.

Various radio frequency synthesizers are known for use in various devices, such as transceivers. The radio frequency synthesizer generates a local oscillator frequency signal for a carrier. The radio frequency synthesizer may include a digital phase lock loop for generating the local oscillator frequency signal. A time to digital converter determines a time difference between the local oscillator frequency signal and a reference signal and provides a digital control signal to a digital processor. The digital processor generates a control signal for a digitally controlled oscillator that generates the local oscillator frequency signal.

Delays and skews may cause quantization errors in the time to digital converter. The quantization errors may cause the time to digital converter to generate an incorrect time difference and thereby cause the digital processor to provide an erroneous control signal to the digitally controlled oscillator.

SUMMARY

Embodiments include circuits and methods for implementing a digital phase lock loop. A circuit comprises a digitally controlled oscillator, a digital processor, a phase acquisition circuit, a counter, a dithering circuit, and a time to digital convertor. The digitally controlled oscillator is configured to generate an oscillator signal having an output frequency based on a control signal. The digital processor has an output to provide the control signal in response to a reference clock and a timing signal. The phase acquisition circuit has an output to provide the timing signal based on a time difference between the oscillator signal and the reference clock. The counter is configured to count clock signals of a feedback signal of the oscillator signal. The dithering circuit configured to add dithering to the reference clock or the feedback signal. The time to digital convertor is configured to generate the timing signal based on a time difference between the feedback signal and the reference clock.

In some embodiments, the dithering circuit is configured to add dithering to the reference clock.

In some embodiments, the dithering circuit is configured to add dithering to the feedback signal.

In some embodiments, the dithering is random noise that is distributed within a resolution of the time difference.

In some embodiments, the dithering circuit is configured to shape the dithering to distribute a majority of energy of the dithering outside a bandwidth of the digital processor and the digitally controlled oscillator providing the control signal to the digitally controlled oscillator.

In some embodiments, the dithering circuit comprises a linear feedback shift register having a plurality of consecutive taps and a summing circuit configured to sum an output signal from each tap using binary weighting.

In some embodiments, the dithering circuit comprises a differentiator configured to differentiate the summed received outputs, and a scaling circuit configured to scale the differentiated summed received outputs of the taps.

In some embodiments, the dithering circuit comprises a delay circuit configured to generate the dithering signal based on a programmable delay of the scaled output of the scaling circuit.

In some embodiments, a method comprises generating a feedback signal from an output signal of a digitally controlled oscillator. Clock signals of the feedback signal are counted. Dithering is added to a reference clock or the feedback signal. A time difference between the feedback signal and the reference clock is determined. A control signal is outputted to control the frequency of the output signal of the digitally controlled oscillator based on the determined time difference.

In some embodiments, adding dithering to the reference clock or the feedback signal comprises adding dithering to the reference clock.

In some embodiments, adding dithering to the reference clock or the feedback signal comprises adding dithering to the feedback signal.

In some embodiments, the dithering is random noise that is distributed within a resolution of the time difference.

In some embodiments, shaping the dithering distributes a majority of energy of the dithering outside a bandwidth of a phase lock loop providing the control signal to the digitally controlled oscillator.

In some embodiments, the dithering is generated.

In some embodiments, generating the dithering comprises receiving an output from each tap of a plurality of consecutive taps of a linear feedback shift register, and summing the received outputs using binary weighting.

In some embodiments, generating the dithering further comprises differentiating the summed received outputs, and scaling the differentiated summed received outputs of the taps.

In some embodiments, a circuit comprises a decoder, a calculator circuit and a register. The decoder is configured to detect a first edge of an oscillator signal and a second edge of the oscillator signal in a digital phase lock loop, the first and second edges being on successive clock pulses of the oscillator signal, measure a time difference between a first edge of an oscillator signal and a second edge of the oscillator signal in a digital phase lock loop, count a first number of time delays between the first edge of the oscillator signal and an edge of a reference clock, the time delays being delays in a time-to-digital convertor, count a second number of time delays between the second edge of the oscillator signal and the edge of the reference clock, and determine a time period of the oscillator signal based on the first number of time delays and the second number of time delays. The calculator circuit is configured to determine a ratio of the time delay and the time period of the oscillator signal based on the first and second number of time delays and the time period of the oscillator signal. The register is configured to provide a phase signal to control a digital processor in the digital phase lock loop based on the ratio of the time delay and the time period of the oscillator signal.

In some embodiments, the first and second edges of the oscillator signal are rising transitions of the oscillator signal.

In some embodiments, the first and second edges of the oscillator signal are falling transitions of the oscillator signal.

In some embodiments, the calculator circuit is further configured to determine an average of the first and second numbers of time delays, and determine a reciprocal of the average.

In some embodiments, the circuit further comprise a digital processor configured to determine whether the phase lock loop is operating in an integer mode, and add a phase offset to the phase signal if the phase lock loop is operating in an integer mode.

In some embodiments, a method comprises measuring a time difference between a first edge of an oscillator signal and a second edge of the oscillator signal in a digital phase lock loop, the first and second edges being on successive clock pulses of the oscillator signal. A first number of time delays between the first edge of the oscillator signal and an edge of a reference clock is counted. The time delays are delays in a time-to-digital convertor. A second number of time delays between the second edge of the oscillator signal and the edge of the reference clock is counted. A time period of the oscillator signal is determined based on the first number of time delays and the second number of time delays. A ratio of the time delay and the time period of the oscillator signal is determined based on the first and second number of time delays and the time period of the oscillator signal. A phase signal is outputted to control a digital processor in the digital phase lock loop based on the ratio of the time delay and the time period of the oscillator signal.

In some embodiments, the first and second edges of the oscillator signal are rising transitions of the oscillator signal.

In some embodiments, the first and second edges of the oscillator signal are falling transitions of the oscillator signal.

In some embodiments, determining a ratio of the time delay and the time period of the oscillator signal based on the first number of time delays and the second number of time delays comprises determining an average of the first and second numbers of time delays, and determining a reciprocal of the average.

In some embodiments, the method further comprises determining whether the phase lock loop is operating in an integer mode, and adding a phase offset to the phase signal if the phase lock loop is operating in an integer mode.

In some embodiments, the time delays in the time-to-digital convertor have a range of zero to 1.5 times the time period of the oscillator signal.

In some embodiments, a circuit comprises a skew error estimator that is configured to detect a first edge of an oscillator signal in a digital phase lock loop, detect an edge of a reference clock, detect a second edge of the oscillator signal, the second edge of the oscillator signal having a different transition type from the first edge of the oscillator signal, generate a detection signal indicative of the edge of the reference clock being near the first edge of the oscillator signal, based on the first and second edges of the oscillator signal and the edge of the reference clock, and output a phase signal to control a digital processor of the digital phase lock loop based on the detection signal.

In some embodiments, the first and second edges of the oscillator signal are rising transitions of the oscillator signal.

In some embodiments, the circuit further comprises a digital processor configured to detect a fractional phase of a time to digital convertor of the digital phase lock loop based on the edge of the reference clock and the first edge of the oscillator signal, and add a correction to the phase signal based on the detected fractional phase and the detection signal.

In some embodiments, a method comprises detecting a first edge of an oscillator signal in a digital phase lock loop. An edge of a reference clock is detected. A second edge of the oscillator signal is detected. The second edge of the oscillator signal has a different transition type from the first edge of the oscillator signal. A detection signal indicative of the edge of the reference clock being near the first edge of the oscillator signal is generated based on the first and second edges of the oscillator signal and the edge of the reference clock. A phase signal is outputted to control a digital processor of the digital phase lock loop based on the detection signal.

In some embodiments, the first and second edges of the oscillator signal are rising transitions of the oscillator signal.

In some embodiments, the method further comprises detecting a fractional phase of a time to digital convertor of the digital phase lock loop based on the edge of the reference clock and the first edge of the oscillator signal, and adding a correction to the phase signal based on the detected fractional phase and the detection signal.

The following detailed description and accompanying drawings provide a better understanding of the nature and advantages of the embodiments described herein.

BRIEF DESCRIPTION OF THE DRAWINGS

FIG. 25 illustrates a table showing the relationship of correction applied to the output phase of the time to digital converter and the estimator output.

DETAILED DESCRIPTION

Described herein are techniques for methods and devices for implementing all-digital phase locked loops. In the following description, for purposes of explanation, numerous examples and specific details are set forth in order to provide a thorough understanding of the disclosure. It will be evident, however, to one skilled in the art that the present invention as defined by the claims may include some or all of the features in these examples alone or in combination with other features described below, and may further include modifications and equivalents of the features and concepts described herein.

Figure 1:
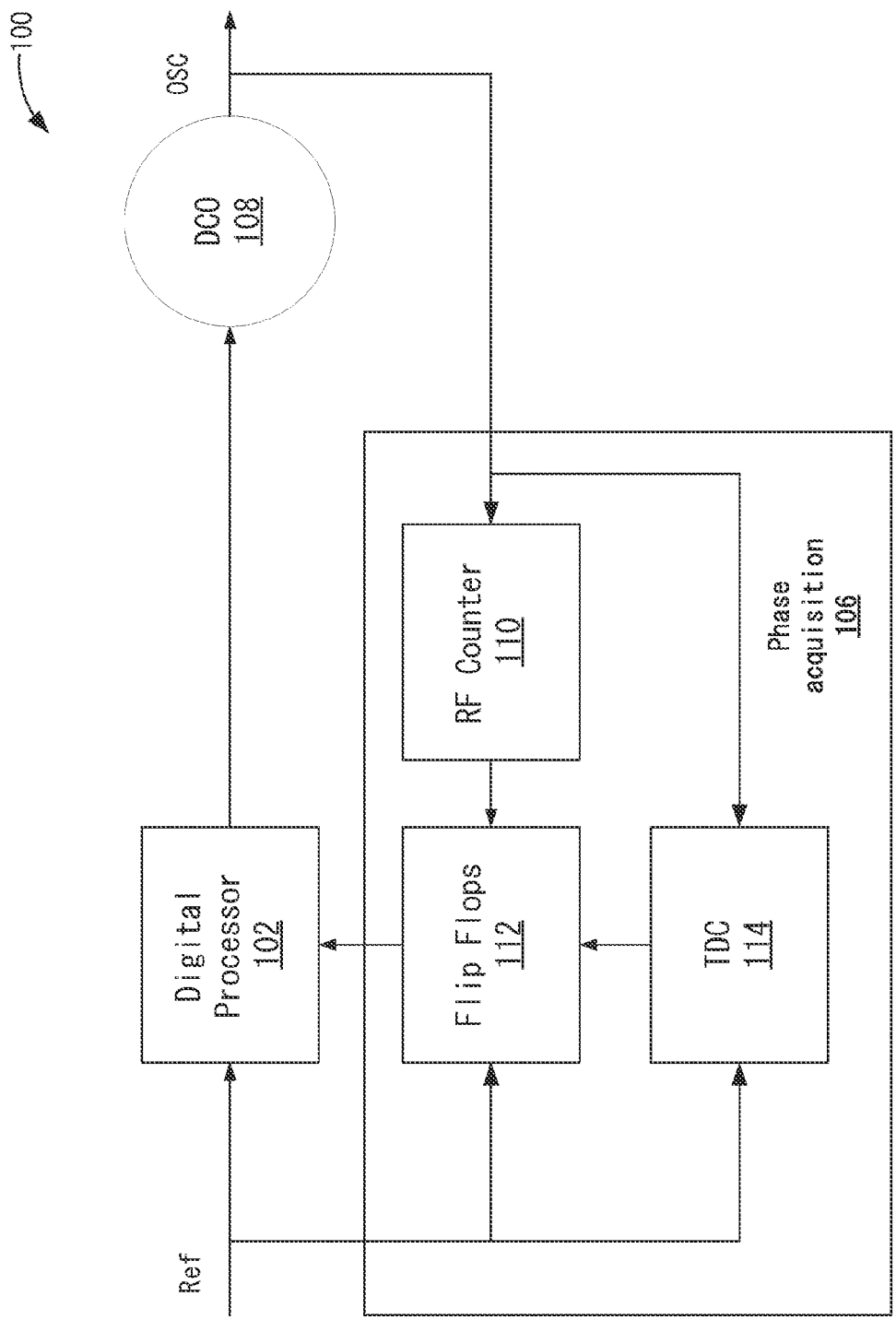
FIG. 1 illustrates an all-digital phase lock loop (ADPLL) according to one embodiment.

FIG. 1 illustrates an all-digital phase lock loop (ADPLL) 100 according to one embodiment. ADPLL 100 generates an oscillator (OSC) signal at a selected frequency $F_{OSC}$ in response to a reference (REF) clock from an external source (not shown), such as a crystal oscillator. ADPLL 100 is a phase lock loop that determines the time difference between the REF clock and a feedback of the OSC signal to generate OSC signal.

ADPLL 100 comprises a digital processor 102, a phase acquisition circuit 106, and a digitally controlled oscillator (DCO) 108. The feedback loop of ADPLL 100 continuously monitors the OSC signal from DCO 108 and performs a fine adjustment of the OSC signal to track the frequency $F_{Ref}$ of the REF clock. Phase acquisition circuit 106 measures the phase of the OSC signal from DCO 108 at the clock rate of the REF clock. Digital processor 102 processes the phase to lock the frequency of DCO 108 on a multiple of the frequency of the REF clock. The frequency $F_{OSC}$ of the OSC signal is a multiple N of the reference clock frequency $F_{Ref}$ of the REF clock:

$$F_{OSC} = N \times F_{Ref}, \text{ where } N \text{ can be a real number.}$$

In some embodiments, the frequency $F_{OSC}$ of the OSC frequency signal is in the range of 1.1 to 1.5 GHz.

Phase acquisition circuit 106 generates a digital control word based on the time difference between the REF clock and the OSC signal and provides the digital control word to digital processor 102. Digital processor 102 provides a control signal to DCO 108 in response to the REF clock and the digital control word from phase acquisition circuit 106. DCO 108 generates the OSC signal in response to the control signal from digital processor 102.

Phase acquisition circuit 106 comprises a radio frequency (RF) counter 110, a flip-flop circuit 112, and a time to digital converter (TDC) 114. Although flip-flop circuit 112 is described separately from time to digital converter 114 for simplicity and clarity, flip-flop circuit 112 may be part of time to digital converter 114. RF counter 110 increments at every clock cycle of the OSC signal to provide coarse phase information as integer multiples of the oscillator period Tosc (the reciprocal of the frequency $F_{OSC}$ of the OSC signal).

Time to digital converter 114 provides fine phase information as a fraction of the oscillator period Tosc to flip-flop circuit 112. The fine phase information may improve the phase noise performance of ADPLL 100. In some embodiments, time to digital converter 114 includes a delay chain.

Time to digital converter 114 determines the fractional portion of the phase count. Time to digital converter 114 has a quantization error that is a phase noise source and may cause an erroneous phase count. Time to digital converter may reduce the quantization error as described in conjunction with FIGS. 2-11. Time to digital converter 114 may also have a delay error that may cause an erroneous phase count. Time to digital converter 114 may reduce the delay error as described in conjunction with FIGS. 12-18. RF counter 110 and time to digital converter 114 may have a skew error. Digital processor 102 may reduce the skew error as described in conjunction with FIGS. 19-26. Although the methods and devices are described separately for reducing different types of errors, the methods and devices can be combined to reducing the errors.

Figure 2:
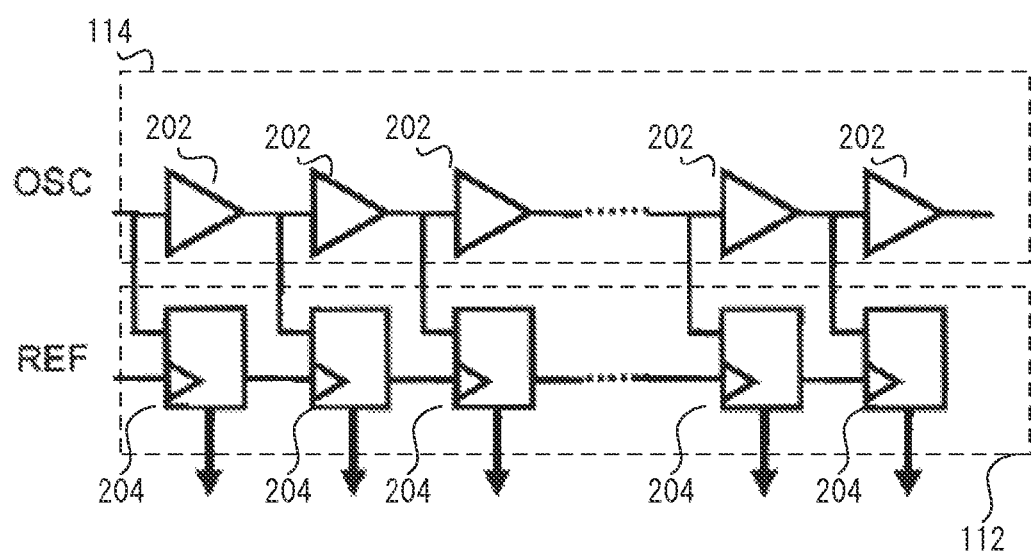
FIG. 2 illustrates a time-to-digital convertor and a flip-circuit of the ADPLL of FIG. 1 according to one embodiment.

FIG. 2 illustrates time to digital converter 114 and flip-flop circuit 112 according to one embodiment. Time to digital converter 114 comprises a delay chain formed a series of delay circuits 202. Each delay circuit 202 has a delay Td, which is the resolution of time to digital converter 114. Flip-flop circuit 112 comprises a series of cascaded flip-flops 204. The output of each delay circuit 202 is coupled to a respective input of flip-flop 204. The REF clock clocks flip-flop 204. The outputs of the flip flops are provided to digital processor 102.

Figure 3:
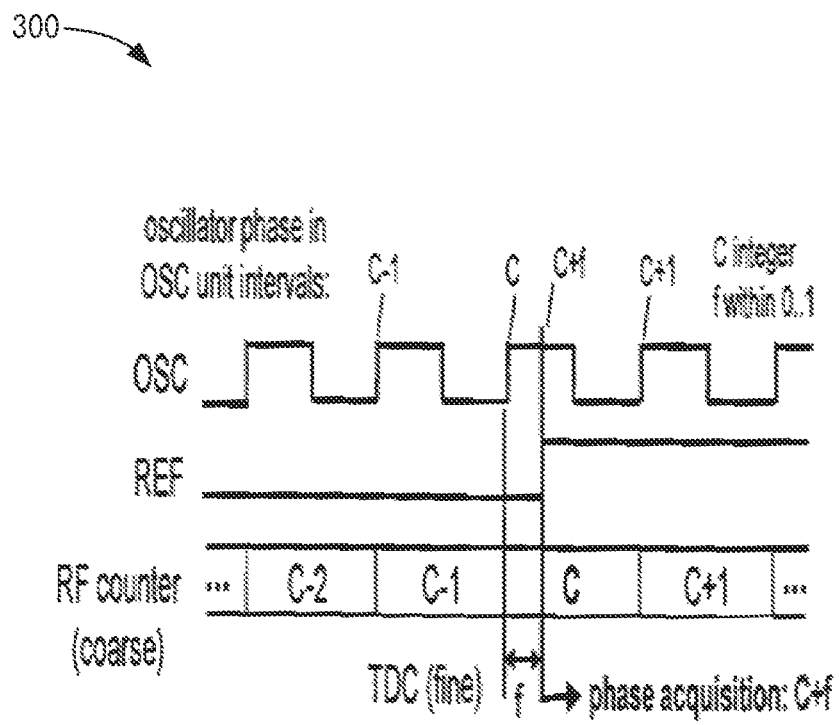
FIG. 3 illustrates a graph showing the relationship between an RF counter of the ADPLL of FIG. 1, a reference clock, and an oscillator signal.

FIG. 3 illustrates a graph showing the relationship between RF counter 110, the REF clock, and the OSC signal according to one embodiment. RF counter 110 provides a coarse count C of clocks of the OSC signal in OSC unit intervals. The coarse count is shown as C−2, C−1, C, C+1 . . . . The REF clock is offset by a fractional phase f from the OSC signal. Time to digital converter 114 provides a count to determine the fractional phase f. The overall phase acquisition is a phase C+f.

Figure 4:
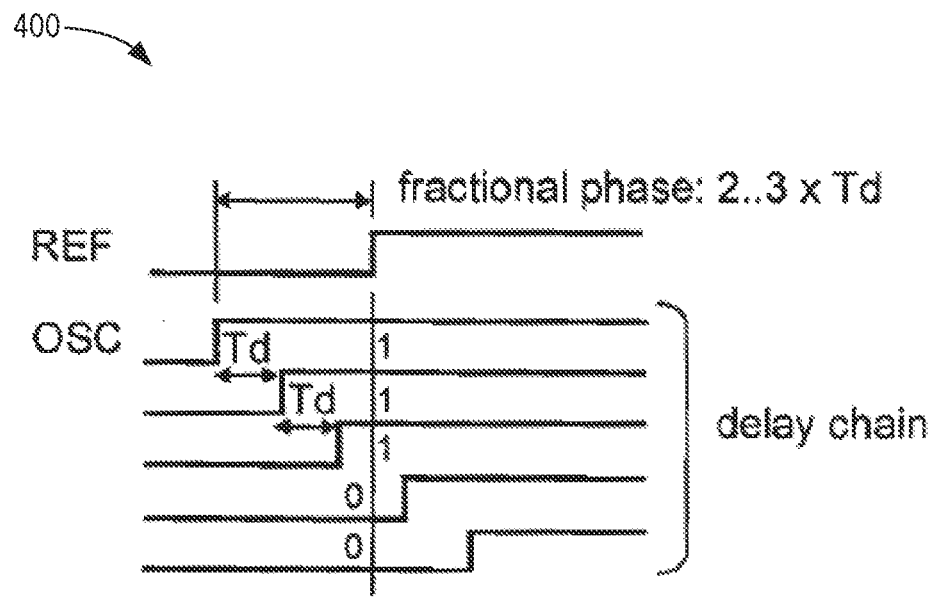
FIG. 4 illustrates a graph showing the relationship between a delay chain of the time-to-digital convertor of FIG. 2, the reference clock and the oscillator signal.

FIG. 4 illustrates a graph showing the relationship between delay circuits 202, the REF clock, and the OSC signal according to one embodiment. Delay circuits 202 determine the number of delays Td for the fractional phase f. In the illustrative example of FIG. 4, the sampled pattern is 11100 where the number of '1' indicates the fractional phase of the OSC signal.

Time to digital converter 114 has a finite phase resolution (e.g., Td/Tosc). Thus, time to digital converter 114 acquires phase information with a quantization error. The quantization error is a phase noise source that may be low-pass filtered with noise from the REF clock by ADPLL 100. Because ADPLL 100 is mostly digital, the quantization error of time to digital converter 114 is the major in-band phase noise contributor to ADPLL 100 at the output of DCO 108.

In some embodiments, if the oscillator phase sampled by time to digital converter 114 is randomly distributed, the quantization noise is uniformly distributed within the resolution of time to digital converter 114, thereby generating white quantization noise, and in turn white in-band phase noise at the output of DCO 108. In some embodiments, the oscillator frequency Fosc tracks the reference clock frequency $F_{Ref}$, and time to digital converter 114 samples the oscillator phase at a reference clock frequency Fref. The phase sampled by time to digital converter 114 is a saw-tooth waveform, leading to a strong periodicity in the quantization noise of time to digital converter 114.

In the operation of ADPLL 100, the frequency Fosc of the OSC signal of ADPLL 100 is shown by:

Fosc=N×Fref, with N any real number(fractional operation): $N=N_{INT}+K_{FRAC}$ where the term $N_{INT}$ is the integer portion of N, and the term $K_{FRAC}$ is the fractional divide portion of N and is between 0 and 1.

In an illustrative example of ADPLL 100 being a type II phase lock loop (two integrations in the phase lock loop) that provides zero phase error so that DCO 108 also tracks the reference phase, the oscillator phase Posc (in unit intervals of the oscillator) is sampled every reference clock cycle at instants k×Tref (Tref=1/Fref) and may be expressed as:

$P_{OSC}^k = k \times (N_{INT}+K_{FRAC})$.

The oscillator phase sampled by the phase acquisition circuit 106 is a ramp. RF counter 110 measures the integer part of Posc, and time to digital converter 114 receives the fractional divide portion $K_{FRAC}$ of Posc. Therefore, the input of time to digital converter 114 at samples k is:

modulo($k \times K_{FRAC}$,1).

The signal input of time to digital converter 114 thus has strong periodicity. For small fractional divide portion $K_{FRAC}$ values, the input of time to digital converter 114 is a saw-tooth slowly ramping from 0 to 1 periodically every $1/K_{FRAC}$ samples. Although DCO 108 adds some noise to $P_{OSC}$, the noise typically is quite small so that the actual phase $P_{OSC}^k$ only slightly deviates from the above described behavior of the noise.

Because the input of time to digital converter 114 is strongly periodic, the quantization error is also a periodic signal. Depending on the fractional $K_{FRAC}$ value, the quantization noise energy can be spectrally concentrated in strong spurious tones in the phase noise spectrum of the OSC signal instead of being spread in a white noise profile. The energy concentration in strong spurious tones occurs for values of the fractional divide portion $K_{FRAC}$ close to rational numbers p/q.

Figure 5:
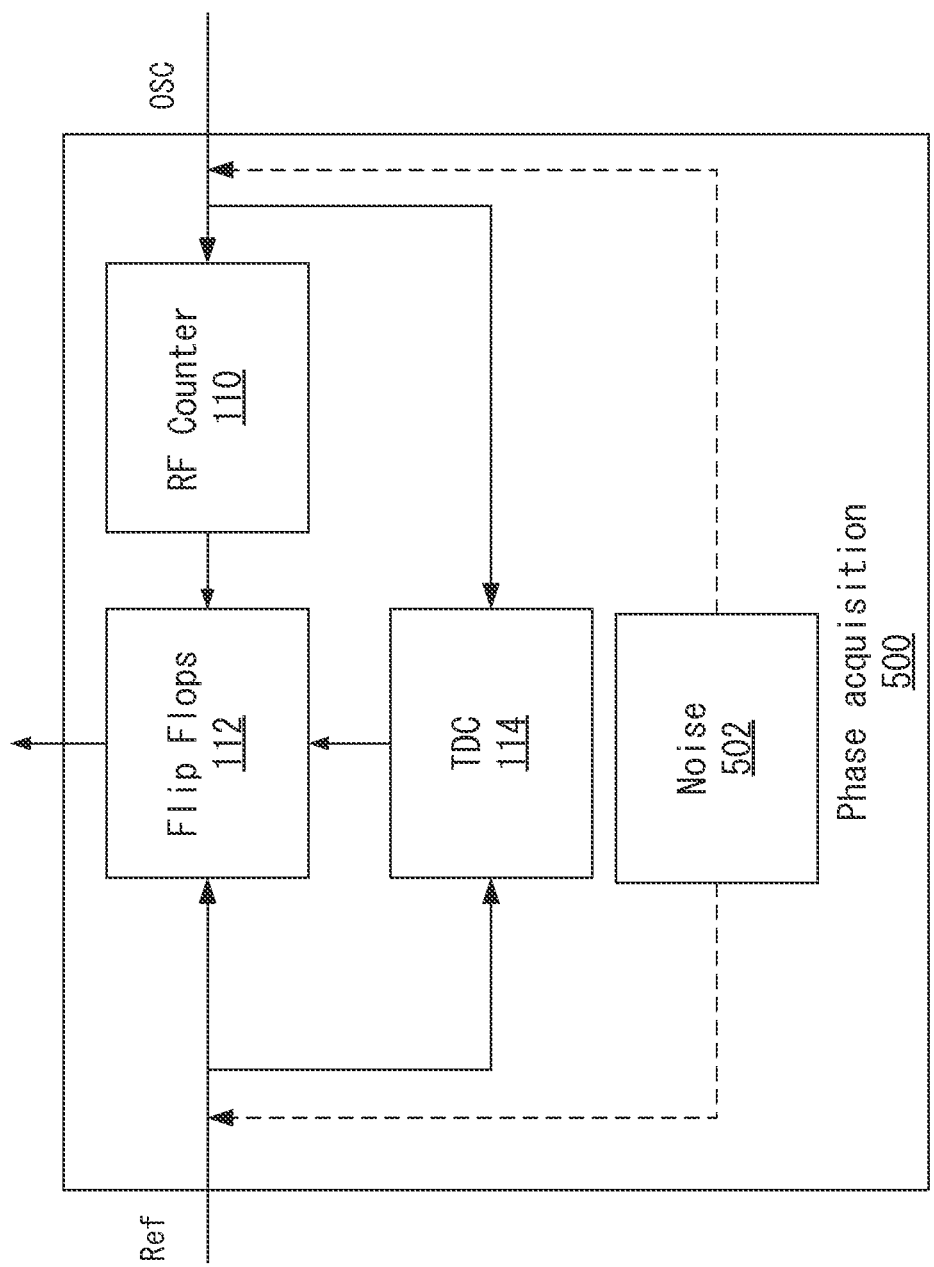
FIG. 5 illustrates a phase acquisition circuit of the ADPLL of FIG. 1 according to one embodiment.

FIG. 5 illustrates a phase acquisition circuit 500 as one embodiment of phase acquisition circuit 106. Phase acquisition circuit 500 adds noise at the phase input of time to digital converter 114 to randomize the quantization noise of time to digital converter 114. Phase acquisition circuit 500 comprises RF counter 110, flip-flop circuit 112, time to digital converter 114, and a noise generator 502. Noise generator 502 is coupled to the REF clock input to phase acquisition circuit 500, the OSC signal input to phase acquisition circuit 500, or both signal inputs. Noise generator 502 dithers the input phase of time to digital converter 114 so as to spread the spurious tones into white noise without degrading the performance of ADPLL 100.

Noise generator 502 adds a random noise at the phase input of time to digital converter 114. The random noise is distributed within the resolution Td of time to digital converter 114 to randomize the quantization noise of time to digital converter 114, so that the noise becomes white noise instead of being concentrated at spurious tones in the PLL phase noise spectrum.

In some embodiments, noise generator 502 provides a digitally controlled programmable delay that is controlled by a pseudorandom bit stream. Noise generator 502 is coupled in front of inputs to time to digital converter 114. Noise generator 502 modifies the amount of delay each time that time to digital converter 114 samples the oscillator phase, such as at a sampling rate of the frequency $F_{Ref}$ of the REF clock. The value of the delay varies from 0 to the TDC resolution, such as the TDC delay Td.

Although noise generator 502 may be coupled in the path of the OSC signal, coupling noise generator 502 to the REF clock may provide advantages because the jitter of the dithering delay is taken into account at the sampling edges of the REF clock and because the OSC signal is at a much higher frequency. Further, the power consumption is much smaller, because the power is proportional to the driving clock frequency. Also, the timing constraints for the synchronization of the delay control word with the edges of the driving clock typically are easier to maintain at low frequency.

Figure 6:
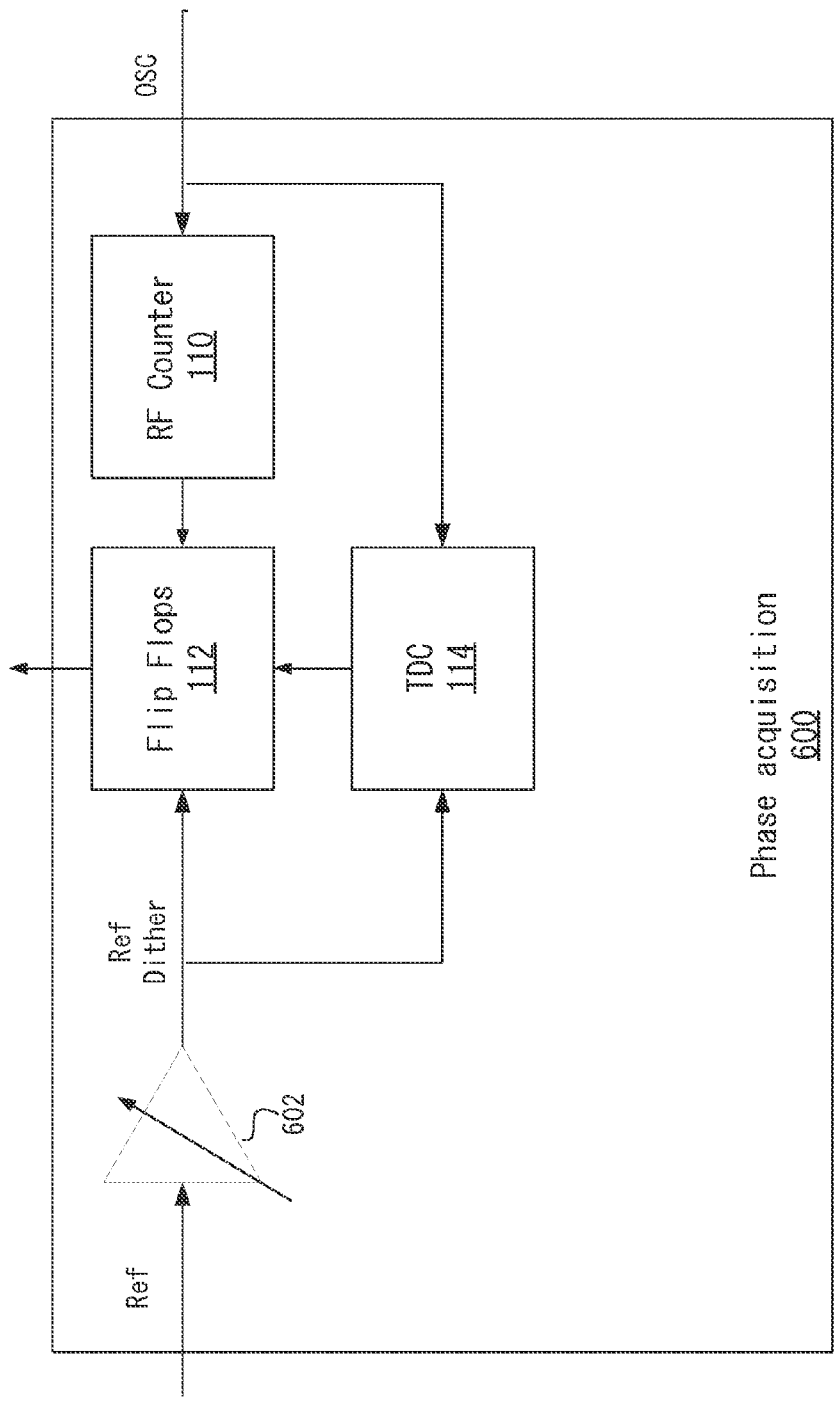
FIG. 6 illustrates a phase acquisition circuit of the phase acquisition circuit of FIG. 5 according to one embodiment.

FIG. 6 illustrates a phase acquisition circuit 600 as one embodiment of phase acquisition circuit 500. Phase acquisition circuit 600 comprises RF counter 110, flip-flop circuit 112, time to digital converter 114, and a noise generator 602. Noise generator 602 dithers the REF clock to generate a Ref Dither signal based on a digitally controlled delay of the REF clock.

Noise generator 602 adds a pseudorandom noise at the phase input of time to digital converter 114. The random noise is distributed within the resolution Td of time to digital converter 114 to randomize the quantization noise of time to digital converter 114, so that the noise becomes white noise instead of being concentrated at spurious tones in the PLL phase noise spectrum.

Figure 7:
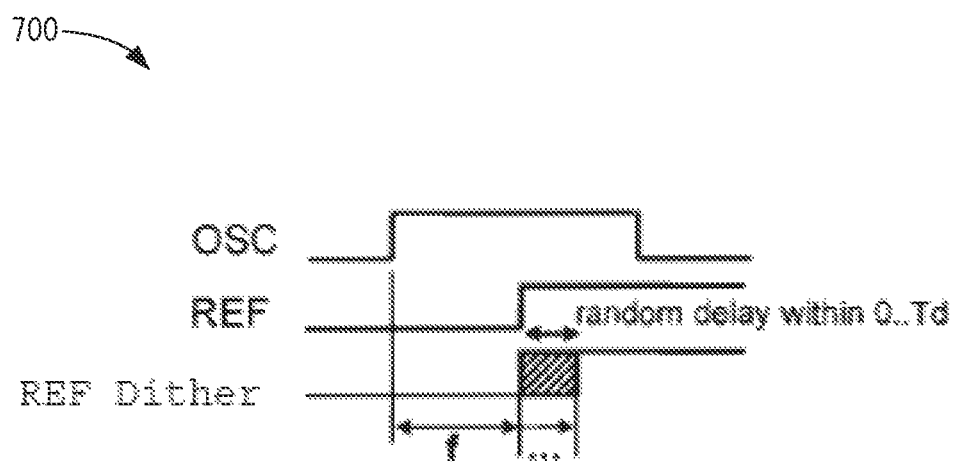
FIG. 7 illustrates a graph showing the relationship between a reference dither signal, the reference clock and the oscillator signal.

FIG. 7 illustrates a graph 700 showing the relationship between the Ref Dither signal, the REF clock and the OSC signal. The edge of the REF clock is a phase f after the edge of the OSC signal. The Ref Dither signal has a random delay between 0 and the resolution Td after the edge of the REF clock.

Figure 8:
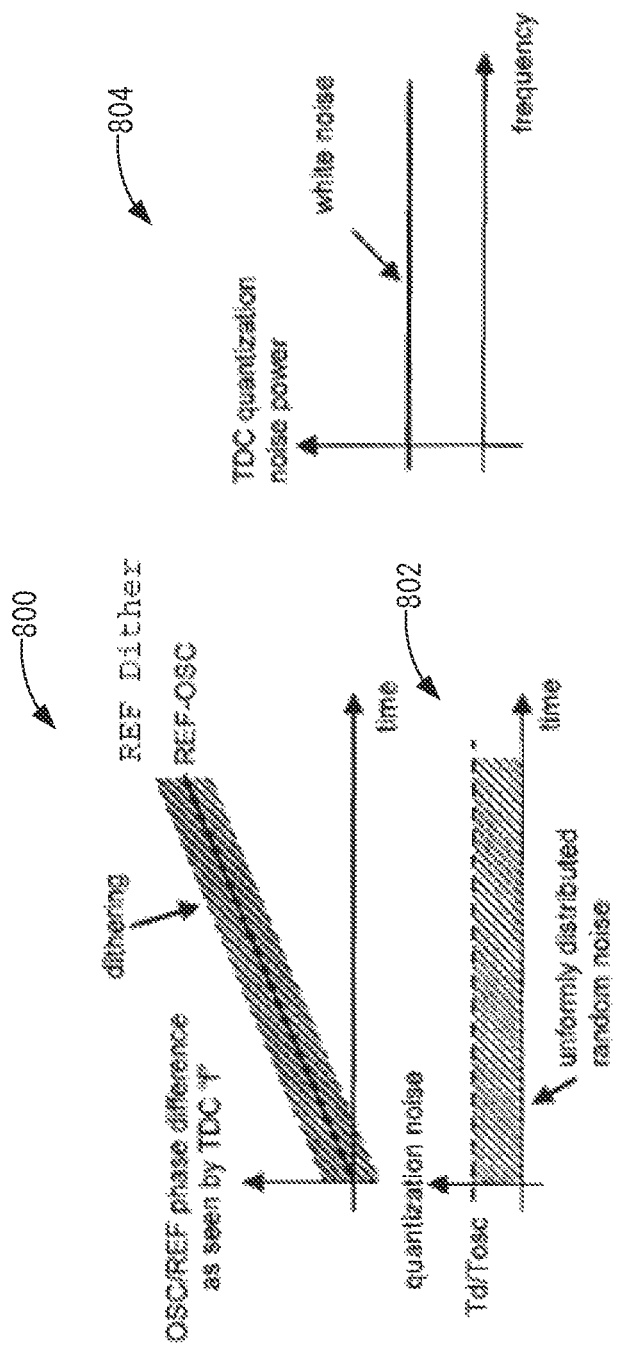
FIG. 8 illustrates a graph showing the relationship between dithering, quantization noise, time and frequency.

FIG. 8 illustrates a graph 800 showing the relationship between the phase difference of the OSC signal and the REF clock relative to time for the REF clock and the Ref Dither Signal. A graph 802 shows the relationship that the quantization noise is uniformly distributed random noise over time. A graph 804 shows the TDC quantization noise power is white noise over frequency because of the dithering.

Figure 9:
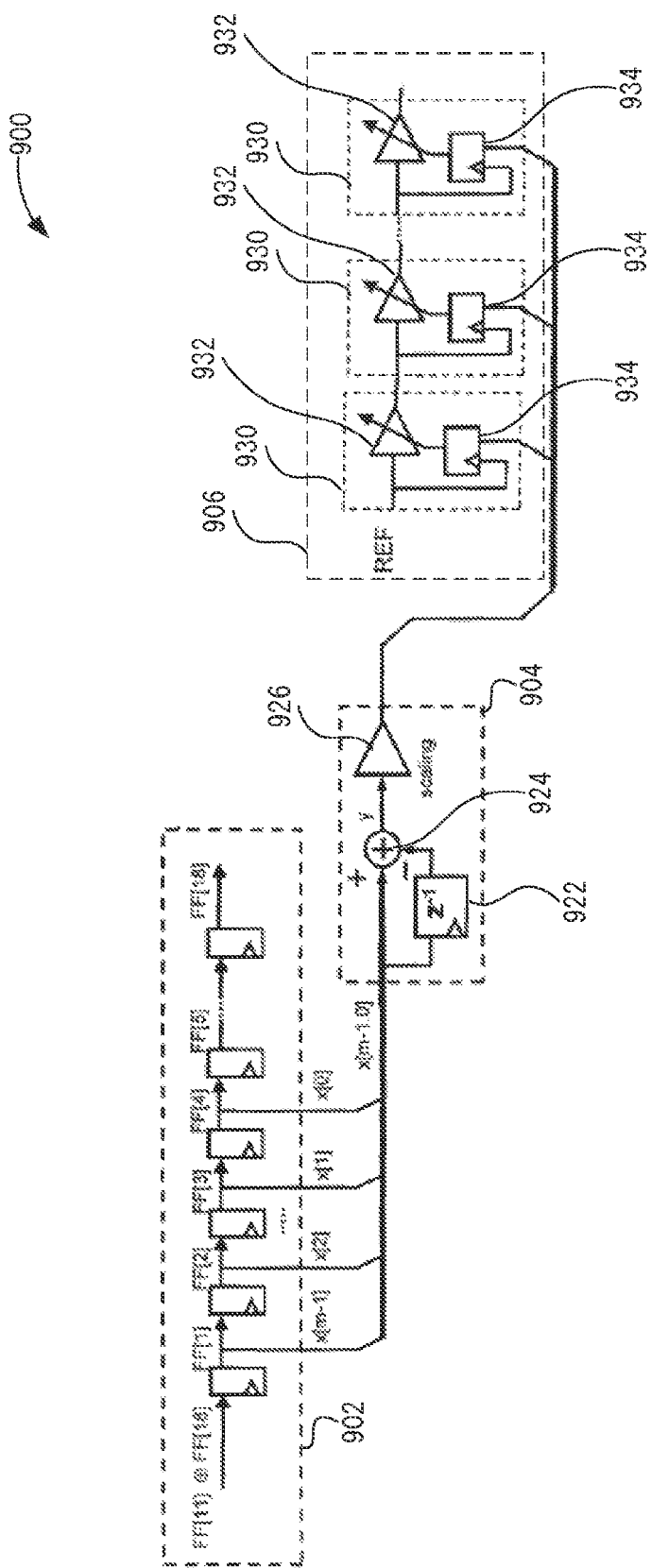
FIG. 9 illustrates a noise generator of the phase acquisition circuit of FIG. 5 according to one embodiment.

FIG. 9 illustrates a noise generator 900 as one embodiment of noise generators 502 and 602. Noise generator 900 comprises a linear feedback shift register 902, a differentiator 904 and a controlled delay circuit 906. Linear feedback shift register 902 is a pseudo-random noise generator and comprises a series of flip-flops that generate a pseudo-random noise sequence in a range of zero to $2^{m-1}$. Differentiator 904 differentiates the pseudo-random noise sequence to shape the noise and shift most of the energy of the dithering outside the bandwidth of ADPLL 100. Controlled delay circuit 906 provides a programmable controlled delay to the REF clock to generate the Ref Dither signal.

Linear feedback shift register 902 generates a pseudo-random sequence x[n] having a power spectrum similar to white noise at low frequencies by taking several consecutives taps of linear feedback shift register 902 and summing the taps together in a binary-weighted manner. In the illustrative example of FIG. 9, linear feedback shift register 902 has 18 bits.

Differentiator 904 comprises a $z^{-1}$ transfer function circuit 922, an adder 924 and a shaper 926. Differentiator 904 differentiates the sequence x[n] using transfer function circuit 922 to multiply the white noise with $|z^{-1}|$ in the z-transform domain and adder 924 to subtract the $z^{-1}$ factored sequence from the initial sequence x[n] to generate the differentiated sequence (y[n]=x[n]−x[n−1]). In the z-transform domain, the white noise is multiplied by $|1-z^{-1}|$. Differentiating the sequence to generate y[n]=x[n]−x[n−1] shifts the noise to higher frequencies. Shaper 926 applies scaling to the sequence y[n] so that the sequence y[n] has the same magnitude as the x[n] sequence.

Controlled delay circuit 906 comprises a plurality of cascaded delay circuits 930. Each delay circuit 930 comprises an inverter 932 and a flip-flop 934. The delay of each inverter 932 may be digitally controlled by a digital control word that can vary the delay in steps between zero and the TDC resolution Td. In some embodiments, the number of steps is selected to provide dithering that behaves close to a uniform random distribution. In some embodiments, inverter 932 is controlled by a 4-bit binary-weighted digital control word.

Differentiator 904 applies the scaled sequence y[n] to cascaded inverters 932. Flip-flop 934 resynchronizes locally in each delay circuit 930 so that the control signal is stable at the edges of the clock driving each delay.

In some embodiments, controlled delay circuit 906 has the same or substantially the same topology as delay circuits 202 of time to digital converter 114. The delay variation of delay circuit 930 substantially equals the delay variation of delays circuits of time to digital converter 114 due to process or temperature variations.

Figure 10:
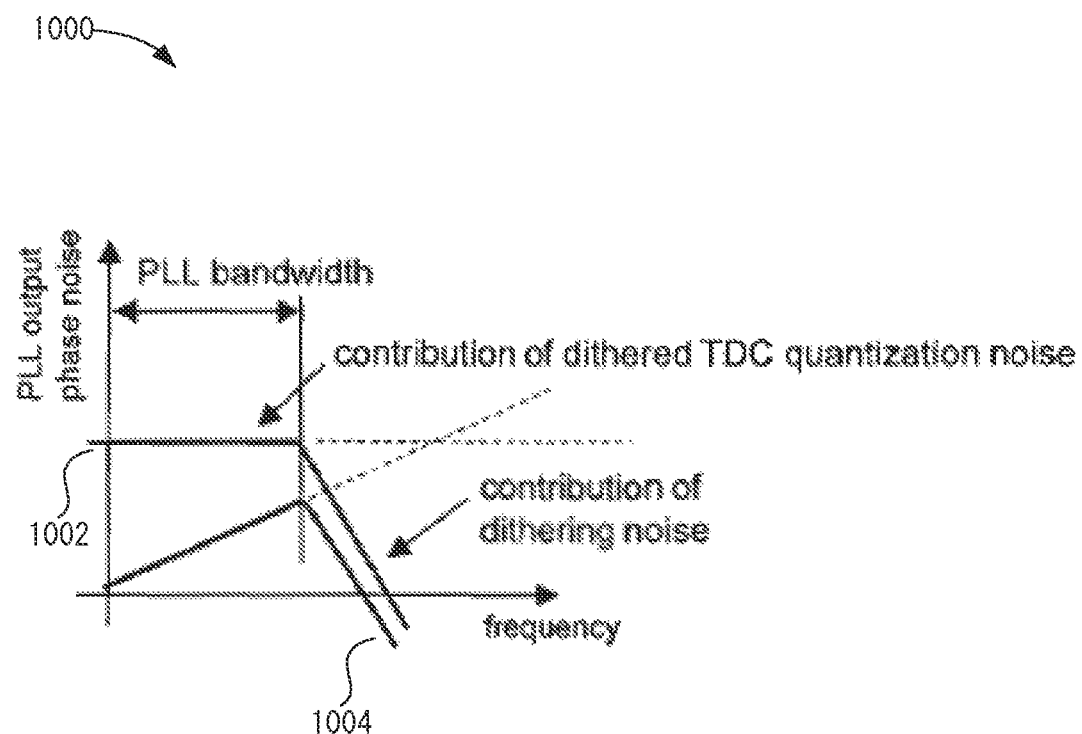
FIG. 10 illustrates a graph showing the relationship of the output noise of the ADPLL of FIG. 1 and frequency.

FIG. 10 illustrates a graph showing the relationship of the output noise of ADPLL 100 and frequency. The dithering introduced by noise generator 900 is additional noise in ADPLL 100 that adds to the TDC quantization noise. Noise generator 900 shifts most of the energy of the dithering outside the bandwidth of ADPLL 100. A line 1002 illustrates the relationship of the phase noise on the output of the OSC signal contributed by the dithered TDC quantization noise to frequency. The ADPLL 100 functions as a low pass filter. Line 1002 drops off outside the bandwidth of ADPLL 100, but would otherwise be flat. A line 1004 illustrates the relationship between the dithering noise that is added by noise generator 900 and frequency. The noise is shifted outside the bandwidth of ADPLL 100. Line 1004 is filtered and drops off outside the bandwidth of ADPLL 100 but would otherwise rise. Although the dithering noise reduces the quantization errors, the shift of the dithering noise does not contribute to the output phase noise of the OSC signal.

Figure 11:
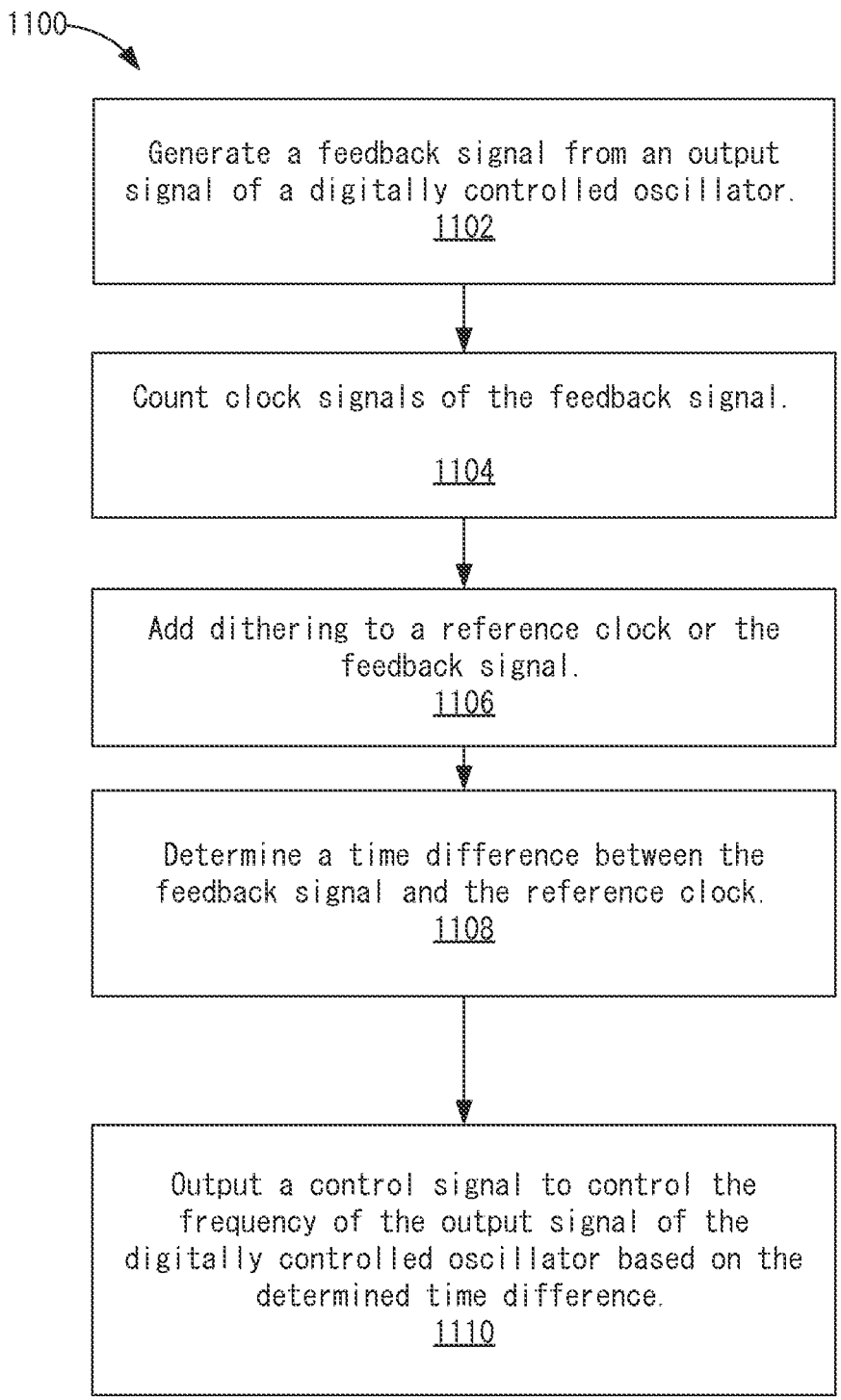
FIG. 11 illustrates a simplified flowchart of a method for generating dithering according to one embodiment.

FIG. 11 illustrates a simplified flowchart of a method for generating dithering according to one embodiment. At 1102, a feedback signal is generated from an output signal of DCO 108. At 1104, clock signals of the feedback signal are counted by RF counter 110. At 1106, dithering is added to a reference clock or the feedback signal by noise generator 502. The dithering may be random noise that is distributed within a resolution of the time difference. At 1108, a time difference between the feedback signal and the reference clock is determined by time to digital converter 114. At 1110, a control signal is outputted to DCO 108 to control the frequency of the OSC signal based on the determined time difference.

Time to digital converter 114 may also have a delay error that may cause an erroneous phase count. Time to digital converter 114 may reduce the delay error as described in conjunction with FIGS. 3 and 12-18.

Referring again to FIG. 3, time to digital converter 114 measures the time difference between the REF clock and the OSC signal in multiples m of the TDC delay Td:

$$\Delta T = m \times Td.$$

In some embodiments, digital processor 102 uses the phase in unit intervals of the OSC signal, such as the time difference ΔT divided by the oscillator period Tosc:

$$\Delta T/Tosc = m \times Td/Tosc.$$

In some embodiments, digital processor 102 estimates the duration of the TDC delays relative to the oscillator period Tosc or uses the delay Td to continuously track the oscillator period Tosc so that the delay TD is an exact sub-multiple of the oscillator period Tosc.

Figure 12:
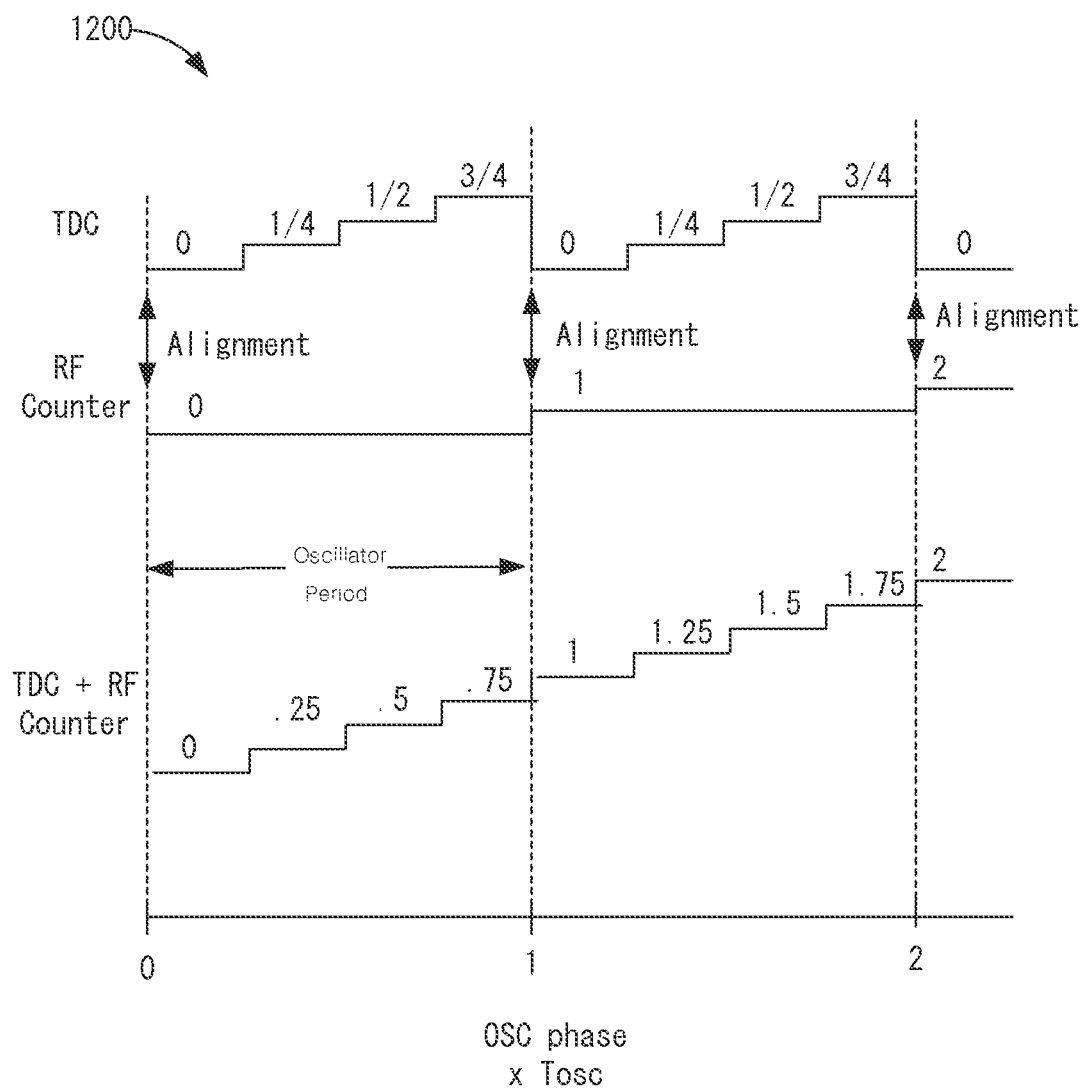
FIG. 12 illustrates a graph showing the ideal response relationship between the outputs of a time-to-digital converter and a counter of the ADPLL of FIG. 1 according to one embodiment.

FIG. 12 illustrates a graph 1200 showing the ideal response relationship between the output of time to digital converter 114, the output of RF counter 110 and the combined outputs of RF counter 110 and time to digital converter 114. As an illustrative example, the ratio of the time delays Td and the oscillator period Tosc is ¼. Digital processor 102 determines the phase of the OSC signal from the recombination C+f of two independent measurements: the integer part of the phase C from RF counter 110 and the fractional part f=ΔT/Tosc=m× Td/Tosc from time to digital converter 114, Time to digital converter 114 increments in ¼ increments and reaches full scale (1) in one oscillator period Tosc. Time to digital converter 114 transitions from full scale to zero with the same input phase at which RF counter 110 increments by one. Likewise the input phase is the same for subsequent increments of RF counter 110. The transitions from full scale to zero of time to digital converter 114, the increments of RF counter 110 and the phase of time to digital converter 114 are aligned.

If time to digital converter 114 does not determine the ratio Td/Tosc precisely, the full scale of time to digital converter 114 (e.g., f=1, ... ΔT=Tosc) does not coincide with the steps (1 ... Tosc) of RF counter 110. The non-coincidence generates significant quantization error in the phase acquisition, and thereby degrades the performance of the output phase noise of ADPLL 100.

Figure 13:
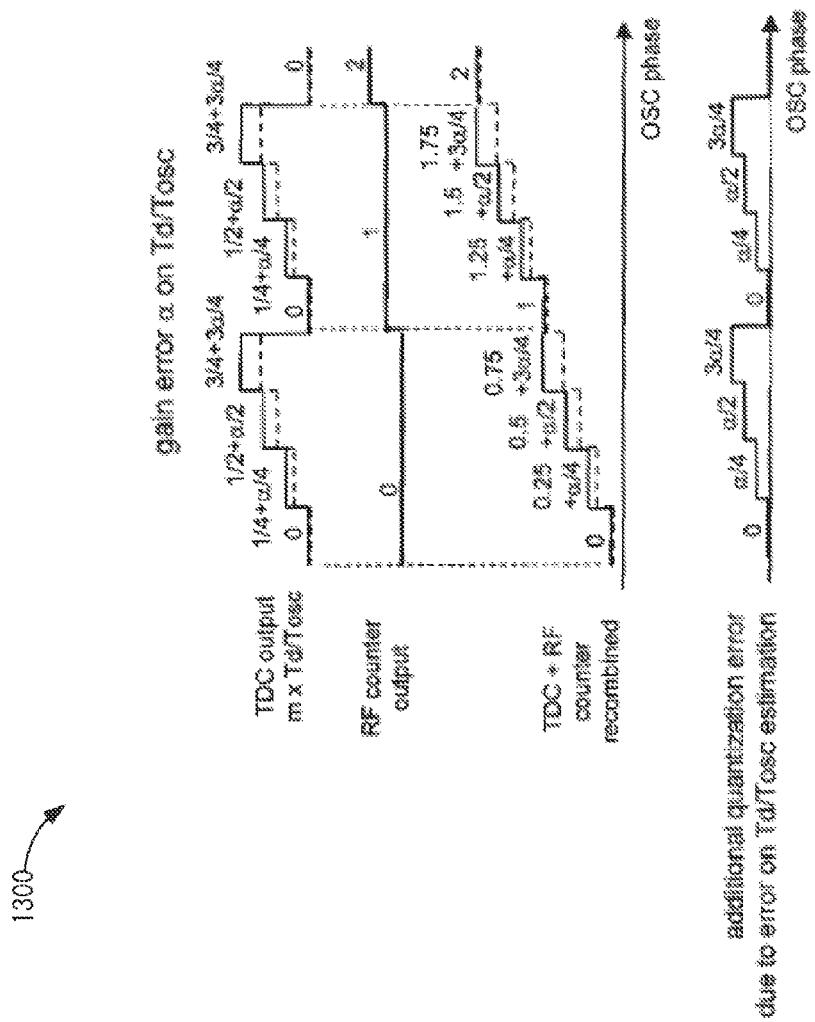
FIG. 13 illustrates a graph showing the relationship between the outputs of a time-to-digital converter and a counter of the ADPLL of FIG. 1 with gain error.

FIG. 13 illustrates a graph 1300 showing the relationship between the output of time to digital converter 114, the output of RF counter 110 and the combined outputs of RF counter 110 and time to digital converter 114 with gain error. A gain error a on the ratio Td/Tosc causes an additional quantization error.

As described above in conjunction with FIG. 4, the input of time to digital converter 114 has a strong periodicity and for small fractional divide portion $K_{FRAC}$, the signal has a sawtooth. Further, the quantization noise generated by the error in the measurement of Td/Tosc is concentrated in spurious tones in spectrum of the output phase noise of ADPLL 100.

Figure 14:
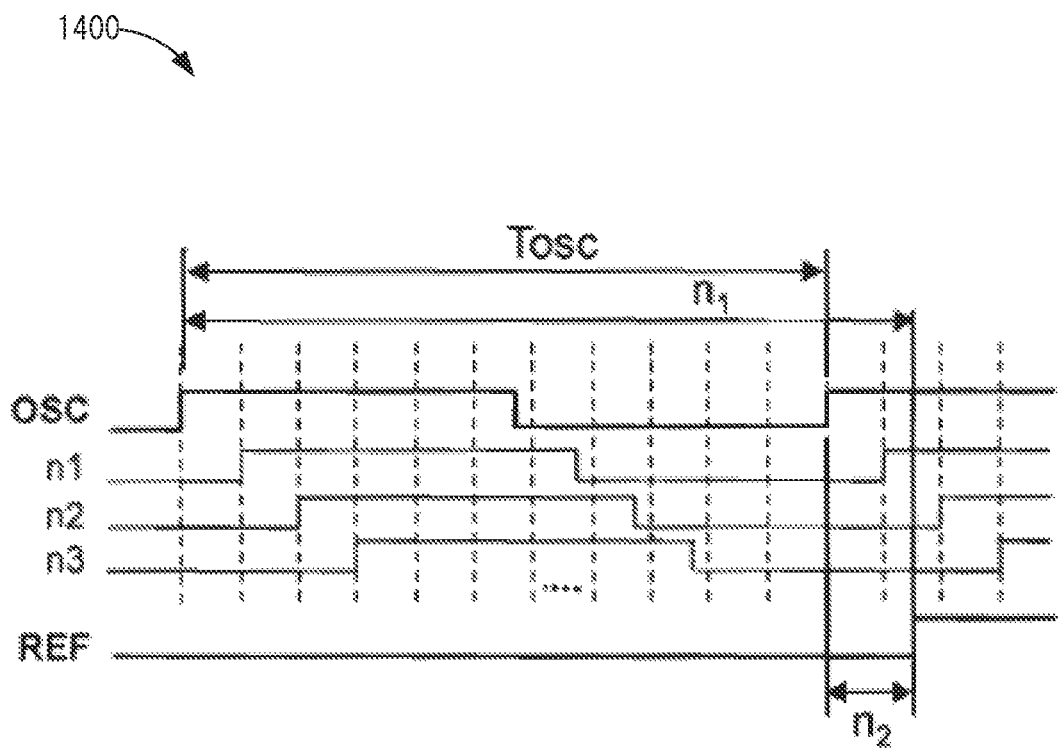
FIG. 14 illustrates a graph showing the relationship between a reference signal, an oscillator signal and delay counts of the ADPLL of FIG. 1.

FIG. 14 illustrates a graph 1400 showing the relationship between the REF clock, the OSC signal, and the delay counts of time to digital converter 114. Time to digital converter 114 determines the ratio Td/Tosc by measuring the time difference between two identical edges of the OSC signal, which are also used in the oscillator phase measurement.

In some embodiments, the oscillator phase is determined from the time difference between the rising edge of the OSC signal and the REF clock using two consecutive rising edges for estimating Td/Tosc. In some embodiments, the rising edges may be from multiple periods Tosc of the OSC signal.

In some embodiments, the oscillator phase is determined from the time difference between the falling edge of the OSC signal and the REF clock using two consecutive falling edges for estimating Td/Tosc. In some embodiments, the falling edges may be from multiple periods Tosc of the OSC signal.

In the illustrative example of FIG. 14, the rising edge of the OSC signal is used to determine phase. The period Tosc of the OSC signal is shown for two consecutive rising edges of the OSC signal.

The integer multiple n1 is the number of TDC delays Td. The time difference ΔT1 corresponds to the TDC phase measurement. The time difference ΔT1 is the time between the first oscillator signal rising edge of the OSC signal and the REF clock and equals:

$\Delta T1 = n1 \times Td$, where $n1$ is the number of $Td$ delays.

The time difference ΔT2 is the time between the second oscillator signal rising edge of the OSC signal and the REF clock, and equals $\Delta T2 = n2 \times Td$, where $n2$ is the number of $Td$ delays.

The times ΔT1 and ΔT2 are extracted from the output of time to digital converter 114 in terms of the integer multiple (n1, n2) of the TDC propagation delay Td. Further, the oscillator period Tosc can be expressed by:

$Tosc = (n1 - n2) \times Td$, and the ratio may be expressed by:

$\Delta T1/Tosc = n1 \times Td/Tosc$.

The ratio ΔTd/Tosc may be determined from the average of the multiples n1 and n2 and computing the reciprocal of the average.

Particular embodiments may provide many advantages. For example, determining the ratio Td/Tosc from measurements between two consecutive rising edges of the Tosc signal is not impacted by the duty-cycle error of DCO 108. As another example, both of the phase measurements ΔT/Tosc and the estimation of the ratio Td/Tosc are based on measuring only the propagation inside time to digital converter 114 of rising edges of the OSC signal. Therefore, the oscillator phase measured by time to digital converter 114 is not impacted by the difference of propagation delays between rising and falling edges.

Although the measurement of the ratio Td/Tosc may be done for every sample, the TDC range would be at least twice the oscillator period 2×Tosc. However, using 1½ of the oscillator period (i.e. 1.5×Tosc) uses less circuits and thus less area and power. Statistically about 50% of the TDC samples will contain two consecutive rising edges so that the ratio Td/Tosc can be updated often enough from the averaging.

Figure 15:
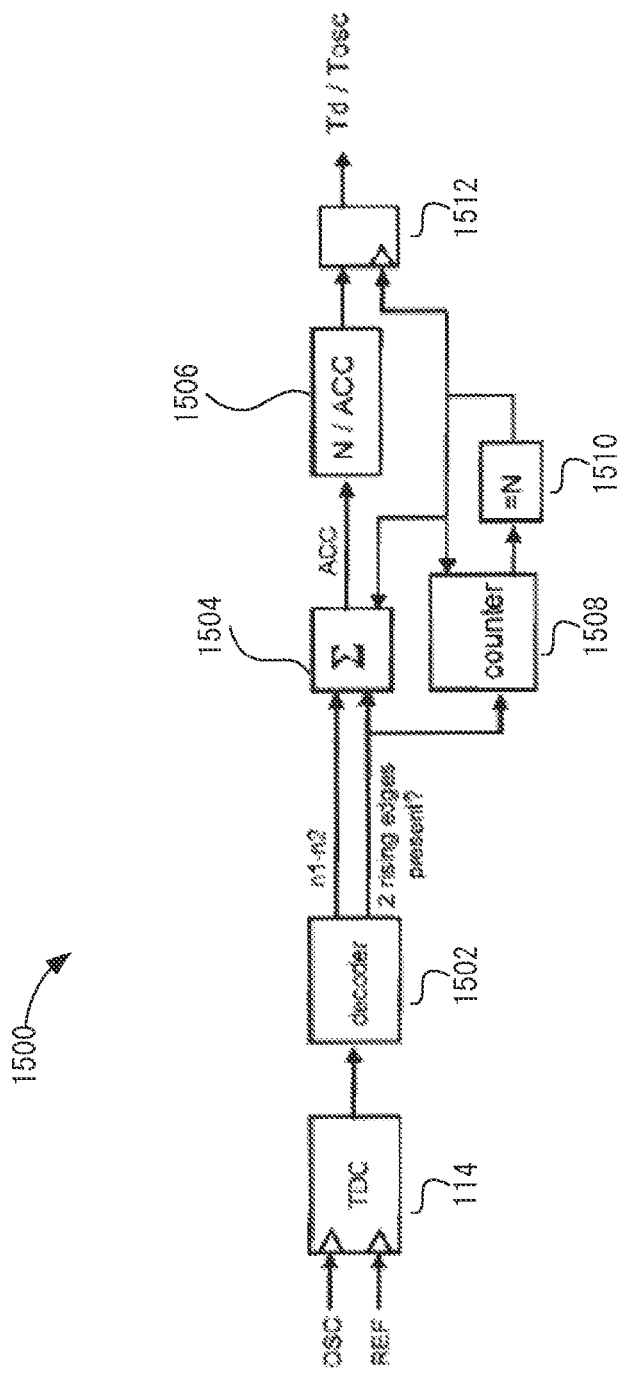
FIG. 15 illustrates a delay estimator according to one embodiment.

FIG. 15 illustrates a delay estimator 1500 in RF counter 110. Delay estimator 1500 determines the ratio of the time delays Td of time to digital converter 114 and the oscillator period Tosc. Delay estimator 1500 is described for detections based on rising edges, but delay estimator 1500 may detect falling edges.

Delay estimator 1500 comprises a decoder 1502, an accumulator 1504, an average calculator 1506, a counter 1508, a maximum count detector 1510, and a flip-flop 1512. With a TDC range of 1.5×Tosc, delay estimator 1500 updates the ratio Td/Tosc whenever the oscillator phase seen by time to digital converter 114 falls in a range between 0 and 0.5, or $f = \Delta T/Tosc$ is within 0 and 0.5

For each acquisition from time to digital converter 114, decoder 1502 decodes each output pattern from time to digital converter 114. If two sequences "01" corresponding to the location of an oscillator rising edge are present, decoder 1502 calculates the difference between the location of the "01" transitions n1−n2 and provides the difference to accumulator 1504. Accumulator 1504 adds the differences and provides the count to average calculator 1506. Decoder 1502 determines whether two rising edges of the OSC signal are present and provides a signal indicating that two rising edges are present to accumulator 1504 and counter 1508. Counter 1508 increments with two rising edges.

Accumulator 1504 provides the accumulated value (ACC) to average calculator 1506, which divides the number of samples N by the accumulated value ACC. When maximum count detector 1510 determines that counter 1508 reaches the desired number of samples N to be used for each averaging of the samples to obtain the ratio of Td/Tosc, maximum count detector 1510 commands flip-flop 1512 to output the ratio Td/Tosc, which is determined as Td/Tosc=N/ACC. Maximum count detector 1510 resets accumulator 1504 and counter 1508 to zero, and the cycle restarts.

Figures 16A, 16B, 16C:
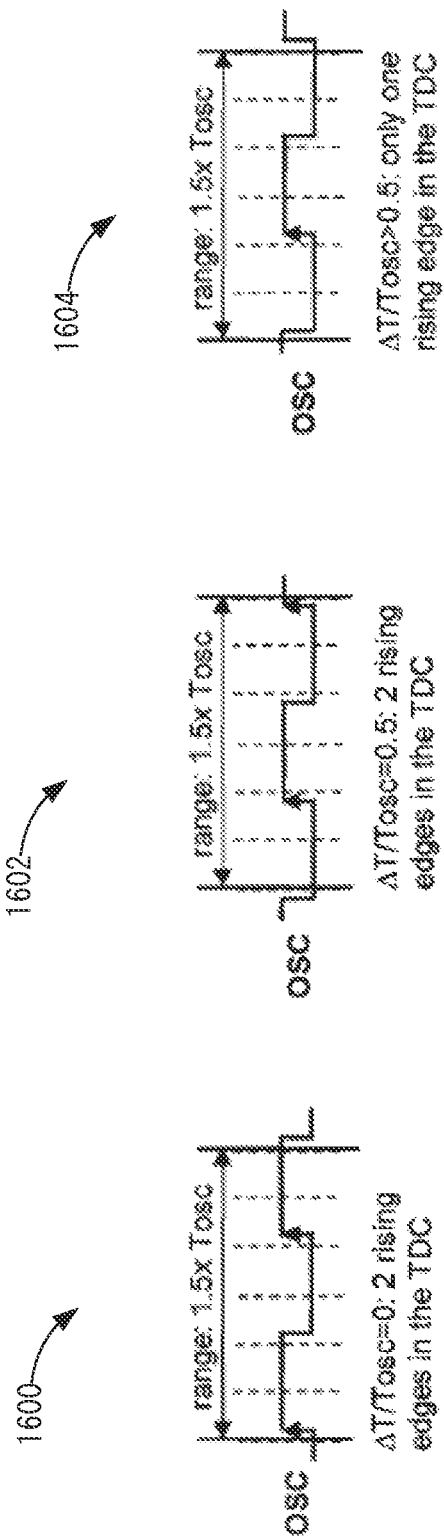
FIGS. 16a, 16b and 16c illustrate graphs showing the relationship between the oscillator signal and a fractional ratio of the time to digital converter resolution to the oscillator period.

FIGS. 16a, 16b and 16c illustrate graphs 1600, 1602, and 1604, respectively, showing the relationship between the OSC signal and the ratio Td/Tosc over a time range of 1.5 Tosc. FIG. 16a shows a ΔT/Tosc of zero and two rising edges of the OSC signal in time to digital converter 114 during the time range. FIG. 16b shows a ΔT/Tosc of 0.5 and two rising edges of the OSC signal in time to digital converter 114 during the time range. FIG. 16c shows a ΔT/Tosc of 0.5 and one rising edge of the OSC signal in time to digital converter 114 during the time range.

Because the oscillator phase Posc is a ramp as described above, two consecutive rising edges are available for all samples k that satisfy:

$\text{Modulo}(k \times K_{FRAC}, 1) < 0.5$

For example, a fractional divide portion $K_{FRAC}$ equals 0.25, two consecutive rising edges occurs for 50% of the samples and for the worst case fractional divide portion $K_{FRAC} = \frac{1}{3}$, two consecutive rising edges occur for 33% of the samples.

Figure 17:
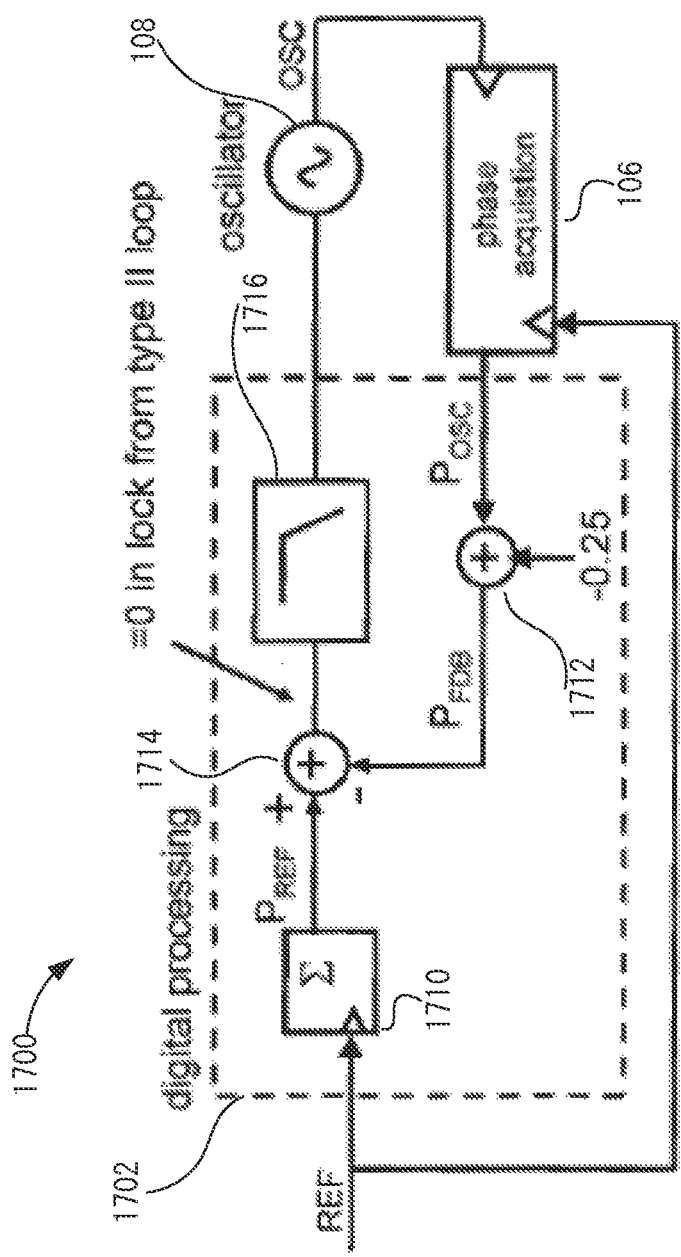
FIG. 17 illustrates an ADPLL using time to digital converter delay estimation according to one embodiment.

FIG. 17 illustrates an ADPLL 1700 using TDC delay estimation. ADPLL 1700 comprises DCO 108, phase acquisition circuit 106, and a digital processor 1702. Time to digital converter 114 provides a constant oscillator phase to digital processor 1702 when ADPLL 1700 operates in an integer mode ($K_{FRAC} = 0$). In the integer mode, RF counter 110 in phase acquisition circuit 106 increments, but time to digital converter 114 does not increment. ADPLL 1700 adds a phase offset to the phase from phase acquisition circuit 106 to force the constant phase seen by time to digital converter 114 to be at a value (e.g., between 0 and 0.5) so that two rising edges are present in time to digital converter 114. By forcing the constant phase, ADPLL 1700 forces the ratio Td/Tosc to be updated.

Digital processor 1702 comprises a reference accumulator 1710, adders 1712 and 1714, and a filter 1716. In one embodiment, ADPLL 1700 is a type II phase lock loop having zero phase error so that the phase in the feedback loop $P_{FDB}$ will be equal to the reference phase $P_{Ref}$ provided by accumulator 1710 when the ADPLL 1700 is locked.

Adder 1712 adds an offset to the loop by adding a phase of −0.25 to the phase $P_{OSC}$ from phase acquisition circuit 106 to generate the feedback loop phase $P_{FDB}$. Reference accumulator 1710 is initialized to 0 at start-up, and increments by the integer count C (see FIG. 3) to generate the reference phase $P_{Ref}$ in response to the REF clock. Adder 1714 subtracts the feedback loop phase $P_{FDB}$ from the reference phase $P_{Ref}$. The subtraction equals zero in lock from a type II loop. Filter 1716 filters the output of adder 1714 and applies the filtered output to DCO 108.

When ADPLL 1700 is in lock, at all samples k, the phase $P_{osc}(k) - 0.25 =$ the phase $P_{Ref}(k)$. Because the phase $P_{Ref}(k)$ is an integer, the fractional phase of Posc, ΔT/Tosc, equals 0.25 within the specified range (0 . . . 0.5) at all times. Time to digital converter 114 updates the ratio ΔT/Tosc at every sample in PLL integer mode.

Figure 18:
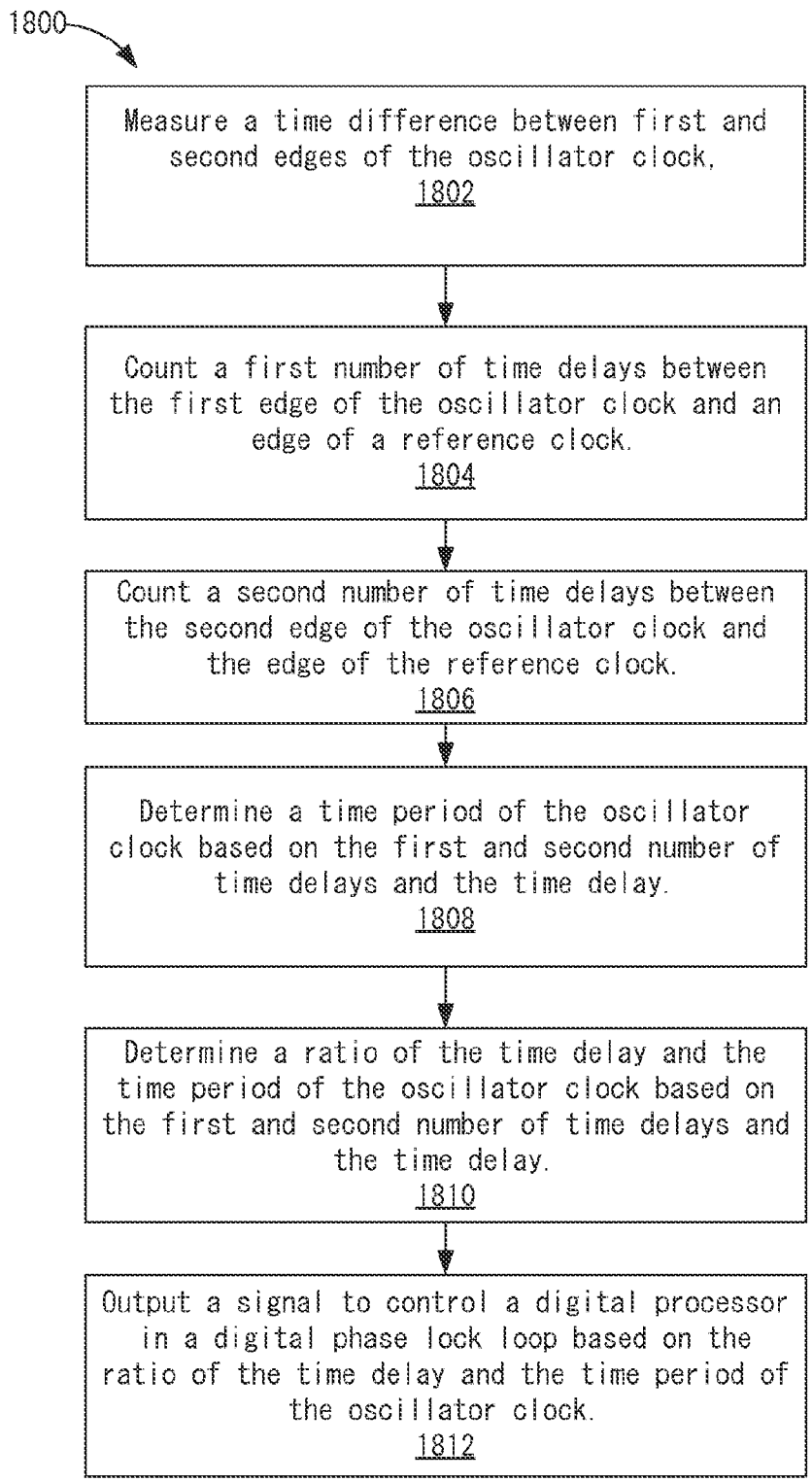
FIG. 18 illustrates a simplified flowchart of a method for generating a ratio of the time to digital converter resolution to the oscillator period according to one embodiment.

FIG. 18 illustrates a simplified flowchart of a method for generating a ratio of the time to digital converter resolution to the oscillator period according to one embodiment. At 1802, a time difference between a first edge of the OSC signal and a second edge of the OSC signal is measured. The first and second edges are on successive clock pulses of the OSC signal. The first and second edges may be rising edges. At 1804, a first number n1 of time delays between the first edge of the OSC signal and an edge of a reference clock is counted. The time delays are delays in time-to-digital convertor 114. At 1806, a second number n2 of time delays between the second edge of the OSC signal and the edge of the reference clock is counted.

At 1808, a time period Tosc of the OSC signal is determined based on the first number n1 and the second number n2 of time delays. At 1810, a ratio of the time delays and the time period of the OSC signal is determined based on the first and second number of time delays and the time period Tosc. The ratio may be determined by determining an average of the first number n1 and the second number n2 of time delays, and determining a reciprocal of the average. At 1812, a signal is outputted to control digital processor 112 based on the ratio of the time delays and the time period of the OSC signal.

RF counter 110 and time to digital converter 114 may have a skew error. Digital processor 102 may reduce the skew error as described in conjunction with FIGS. 19-26.

Figure 19:
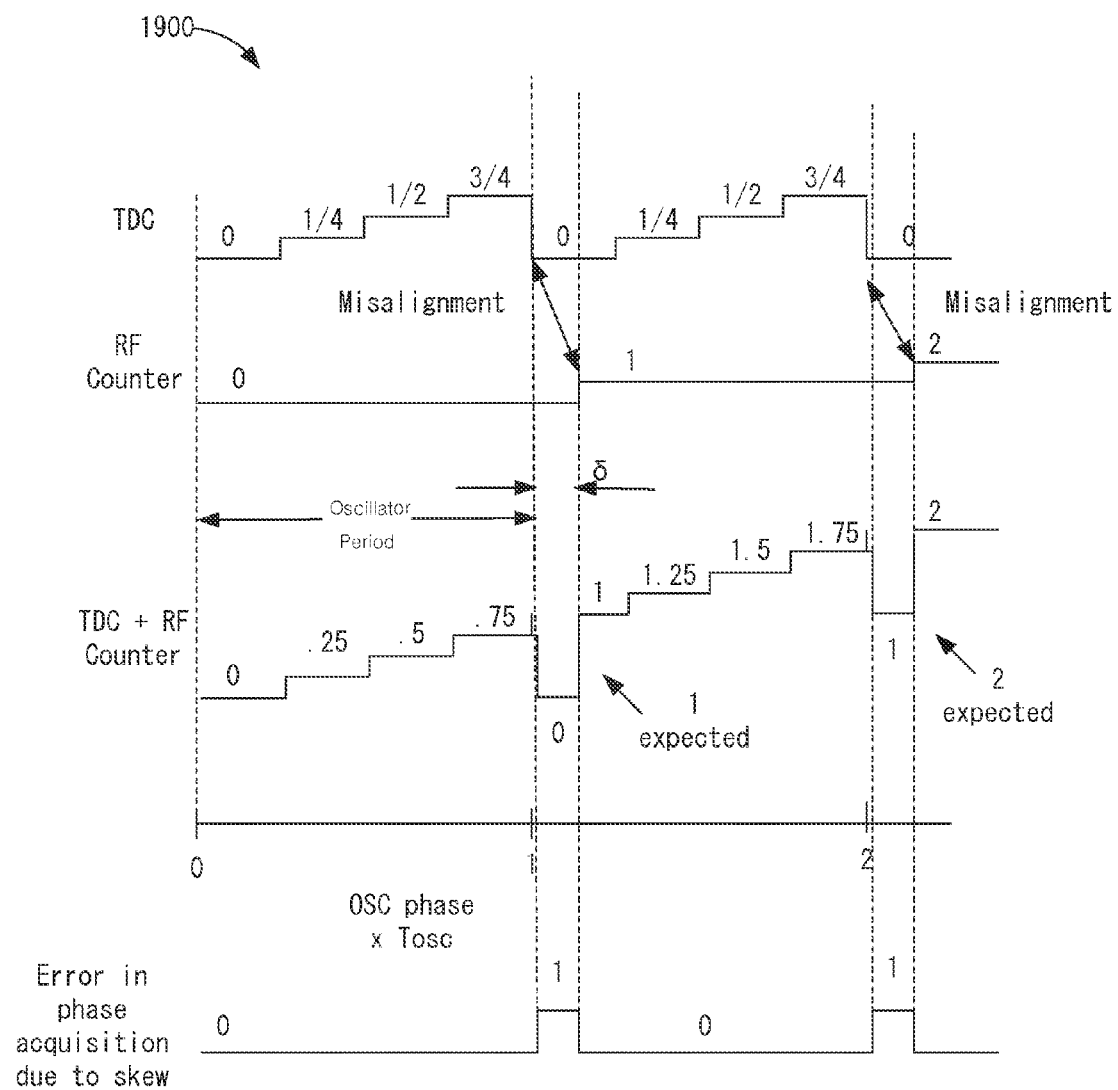
FIG. 19 illustrates a graph showing the relationship between the outputs of a time-to-digital converter and a counter of the ADPLL of FIG. 1 with slew error.

FIG. 19 illustrates a graph showing the relationship between the outputs of time-to-digital converter 114 and RF counter 110 with skew error according to one embodiment. As an illustrative example, the ratio of the time delays Td and the oscillator period Tosc is ¼.

As described above in conjunction with FIG. 12, in an ideal response, the transitions from full scale to zero of time to digital converter 114, the increments of RF counter 110 and the phase of time to digital converter 114 are aligned. However, time to digital converter 114 and RF counter 110 may have internal delays or clock paths may have delays so that the transitions may not be aligned. An offset or skew delta in the alignment between the output versus input phase characteristics of time to digital converter 114 and RF counter 110 may occur.

If time to digital converter 114 transitions from full scale to zero before RF counter 110 increments, the sum drops a full count until RF counter 110 increments. For example, when time to digital converter 114 transitions from full scale to zero and RF counter 110 remains at zero, the sum is zero. When RF counter 110 increments, the sum transitions from zero to one. The skew delta may be made small; the resulting recombined phase C+f is erroneous only for a small number of phase values within the oscillator period Tosc. However, the error in the phase acquisition corresponds to a phase shift of an entire oscillator period Tosc. Thus, even if the occurrence of an error due to the skew is somewhat small, the magnitude of the error is large, and the error generates, on average, a significant TDC quantization error of time to digital converter 114. If uncorrected, this error may dramatically degrade the in-band phase noise performance at the output of ADPLL 100.

RF counter 110 detects and corrects the skew delta between the phases of time to digital converter 114 and RF counter 110 as described in conjunction with FIGS. 20-26.

Figure 20:
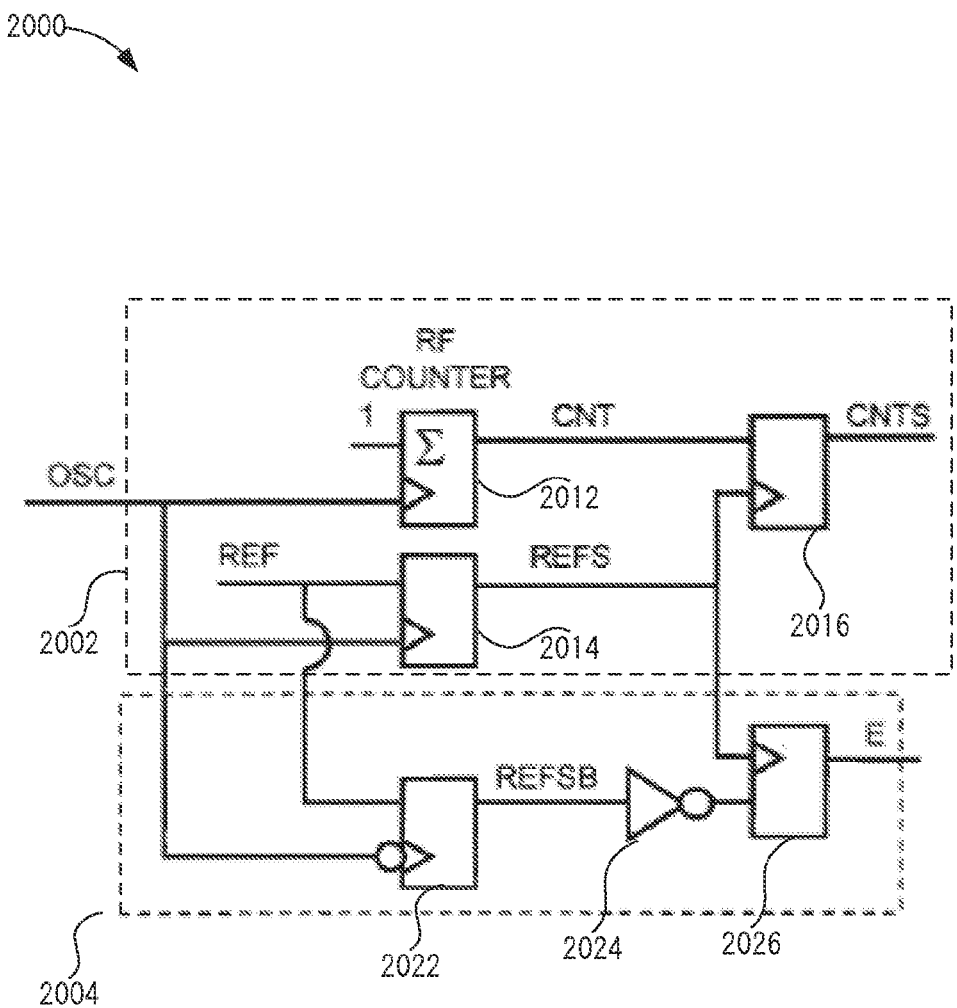
FIG. 20 illustrates a skew correction circuit according to one embodiment.

FIG. 20 illustrates a skew correction circuit 2000 according to one embodiment. Skew correction circuit 2000 may be part to of RF counter 110. Skew correction circuit 2000 comprises a resampling circuit 2002 and a skew error estimator 2004.

Resampling circuit 2002 generates a synchronized counter (CNTS) signal that indicates the count of the OSC signal synchronized to the REF clock.

Skew error estimator 2004 detects skew between the OSC signal and the REF clock and provides a signal for correcting the skew. Skew error estimator 2004 indicates whether the fractional oscillator phase f=ΔT/Tosc is near zero (ΔT=0), or near 1 (ΔT=Tosc) independent of the actual fractional phase $f_A$ measured by time to digital converter 114.

Skew error estimator 2004 samples the REF clock on the same edge of the OSC signal that clocks resampling circuit 2002 (e.g., the rising edge) to generates a synchronized Refs clock. Skew error estimator 2004 also samples the REF clock on the opposite edge (e.g. the falling edge) of the OSC signal to generate a time shifted reference (REFSB) clock, and then resample the REFSB clock again with the synchronized Refs clock. Skew error estimator 2004 generates an estimator output E that is used to detect errors related to the skew.

Resampling circuit 2002 comprises a counter 2012, a flip-flop 2014, and a flip-flop 2016. Counter 2012 counts the clocks of the OSC signal to generate a count (CNT) signal. Flip-flop 2014 resamples the REF clock with the OSC signal to generate synchronized Refs clock. Flip-flop 2016 samples the count signal in response to the synchronized Refs clock. Flip-flop 2016 samples the RF count at every reference clock edge.

Flip-flop 2014 may comprise one or more resampling flip-flops cascaded in the path of the REF clock and the synchronized Refs clock. Greater numbers of flip-flops reduce the likelihood of metastability. Although additional flip-flops may generate an offset between the RF counter value of counter 2012 and the sample value, the offset has no impact on the PLL loop operation. For simplicity and clarify, a flip-flop 2014 comprising one flip-flop is described.

Skew error estimator 2004 comprises a flip-flop 2022, an inverter 2024, and a flip-flop 2026. Because flip-flop 2022 samples the reference clock Ref of the opposite clock edge of the OSC signal, the time shifted signal RefSB is the REF clock time-shifted by about half an oscillator period Tosc/2. When the edge of the REF clock is near the edge of the OSC signal, skew error estimator 2004 can generate the estimator output E. If the edge of the Ref clock leads the edge of the OSC signal, the edge of the synchronized Refs clock is very close to the edge of the REF clock. When flip-flop 2026 samples the time shifted signal RefSB (and by inverting the sampled data by inverter 2024), skew error estimator 2004 generates an estimator output E of E=1. If the edge of the Ref clock lags the edge of the OSC signal, the edge of the synchronized Refs clock will be time shifted by about one oscillator period. When flip-flop 2026 samples the time shifted signal RefSB (and by inverting the sampled data by inverter 2024), skew error estimator 2004 generates an estimator output E of E=0.

Skew error estimator 2004 also detects whether the REF clock leads or lags the OSC signal. If the edge of the Ref clock leads the edge of the OSC signal, the fractional phase f is near '1', and skew error estimator 2004 generates an estimator output E of E=1. If the edge of the Ref clock lags the edge of the OSC signal, the fractional phase f is near '0', and skew error estimator 2004 generates an estimator output E of E=0.

As described above, when the fractional phase f is near '0' or '1', there can be a discrepancy of one oscillator unit interval between the phase measurements of time-to-digital converter 114 and RF counter 110 due to skew. Skew error estimator 2004 determines whether the TDC value f is expected to be near '0' or '1' given the value measured in RF counter 100, independent of the actual phase $f_A$ measured by time to digital converter 114.

Figure 21:
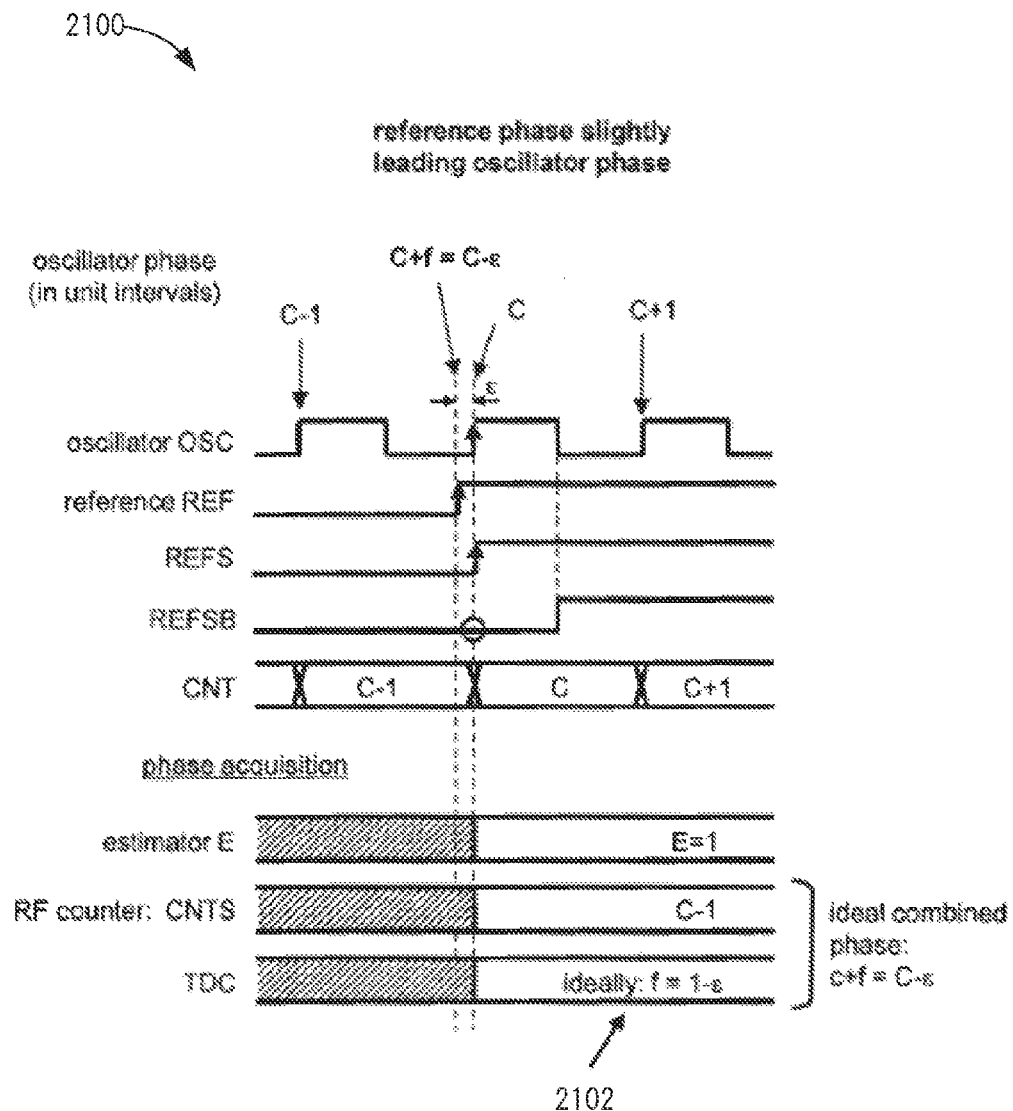
FIG. 21 illustrates a graph showing the relationship of skew correction signals when the phase of the reference signal leads the phase of the oscillator signal.

FIG. 21 illustrates a graph 2100 showing the relationship of skew correction signals when the phase of the REF clock leads the phase of the OSC signal according to one embodiment. The rising edge of the REF clock leads the count C of the OSC signal by a time E. At the rising edge of the synchronized Refs clock, skew error estimator 2004 generates an estimator output E equaling '1'. During the time period 2102, the actual fraction $f_A$ output of time to digital converter 114 is ideally near '1' based on the estimator output E equaling '1'. However, because of the skew, the actual fraction $f_A$ output can be near zero. The synchronized count CNTS of resampling circuit 2002 has a count of C−1. The count f of time to digital converter 114 is 1−ϵ. The combined count of oscillator phases is C+f=C−ϵ.

Figure 22:
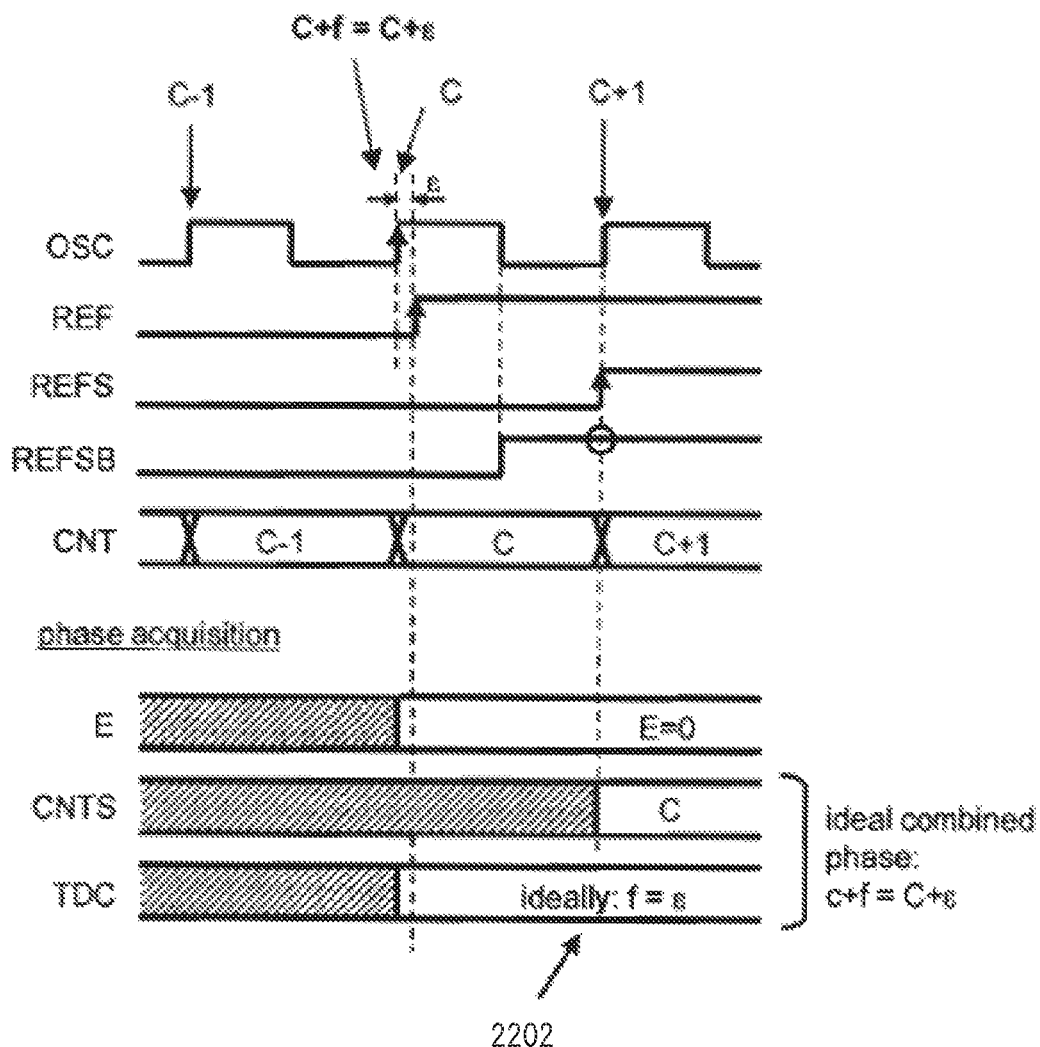
FIG. 22 illustrates a graph showing the relationship of skew correction signals when the phase of the reference signal lags the phase of the oscillator signal.

FIG. 22 illustrates a graph 2200 showing the relationship of skew correction signals when the phase of the REF clock lags the phase of the OSC signal according to one embodiment. The rising edge of the REF clock lags the count C of the OSC signal by a time E. Because the rising edge of the synchronized Refs clock has not occurred, skew error estimator 2004 generates an estimator output E equaling '0'. During the time period 2202, the fraction $f_A$ output of time to digital converter 114 is ideally near '0' based on the estimator output E equaling '0'. However, because of the skew, the actual fraction $f_A$ output can be near '1'. The synchronized count CNTS of resampling circuit 2002 has a count of C−1 until the synchronized Refs clock rising edge when the count is incremented to C. The count f of time to digital converter 114 is ϵ. The combined count of oscillator phases is C+f=C+ϵ.

Digital processor 102 detects whether there is a discrepancy between the phase C from RF counter 110 and the actual fraction $f_A$ output of time to digital converter 114 by determining whether the actual fraction $f_A$ output is consistent with the estimator output E. Digital processor 102 corrects the discrepancy between the phase C from RF counter 110 and the fractional phase $f_A$ from time to digital converter 114. If the fractional phase $f_A$ is near 0 and the estimator output E equals '1', digital processor 102 adds '+1' to the combined phase result C+$f_A$. On the other hand, if the TDC output $f_A$ is near '1' and the estimator output E equals '0', digital processor 102 adds '−1' to the combined phase result C+$f_A$.

Figure 23:
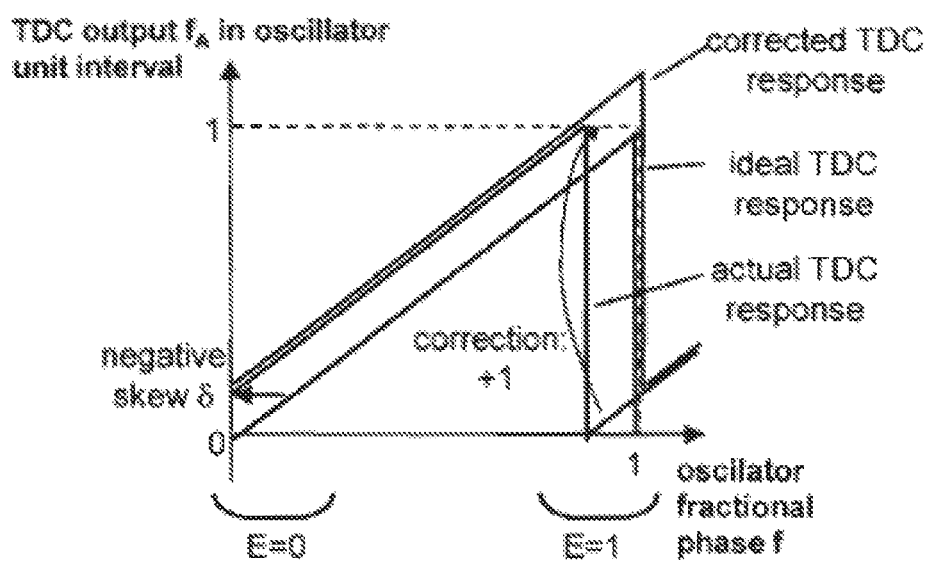
FIG. 23 illustrates a graph showing the relationship of fractional counts and oscillator fractional phase for negative skew.

FIG. 23 illustrates a graph 2300 showing the relationship of fractional counts and oscillator fractional phase for negative skew according to one embodiment. As the negative skew causes the actual TDC output $f_A$ to fall to '0', the fall occurs when the estimator output E equals '1'. Digital processor 102 adds '+1' to the combined phase result C+$f_A$ so that the corrected TDC response causes the TDC output $f_A$ to rise to '1'.

Figure 24:
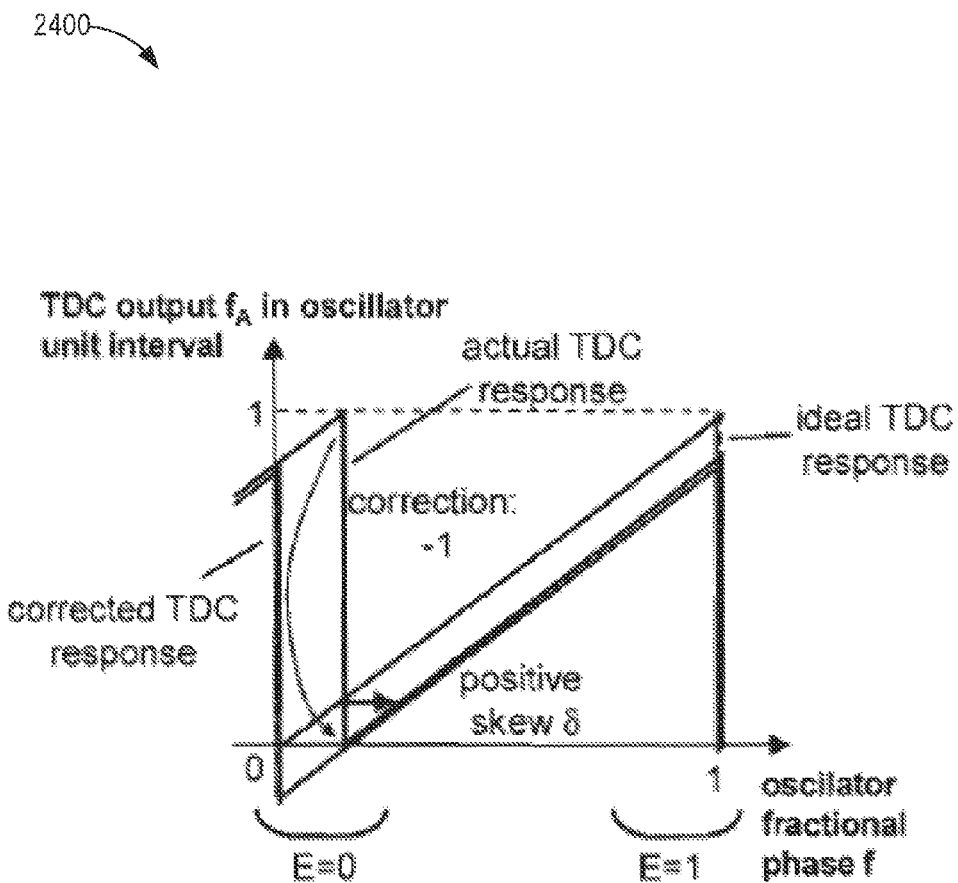
FIG. 24 illustrates a graph showing the relationship of fractional counts and oscillator fractional phase for positive skew.

FIG. 24 illustrates a graph 2400 showing the relationship of fractional counts and oscillator fractional phase for positive skew according to one embodiment. As the positive skew causes the actual TDC output $f_A$ to rise to '1', the rise occurs when the estimator output E equals '0'. Digital processor 102 adds '−1' to the combined phase result C+$f_A$ so that the corrected TDC response causes the TDC output $f_A$ to fall to '0'.

FIG. 25 illustrates a table 2500 showing the relationship of correction applied to the output phase of time to digital converter 114 and the estimator output E according to one embodiment. In some embodiments, the estimator output E may be invalid if the fractional phase f is around 0.5. At this fractional phase, the edge of the REF clock is near the falling edge of the OSC signal that is sampling the REF clock. In some embodiments, additional circuits may be included in skew error estimator 2004 to provide another output if the estimator output E is invalid. In some embodiments, digital processor 102 compares the TDC output $f_A$ to the estimator output E and provides the correction, if TDC output $f_A$ is not within a distance TH of either '0' or '1'. The distance TH may be selected to be as far away from '0' or '1', so as to properly detect and correct the error due to the largest skew when f is near '0' or '1' while the estimator output E is valid. Table 2500 illustrates the correction that digital processor 102 applies to the phase correction C+$f_A$.

Figure 26:
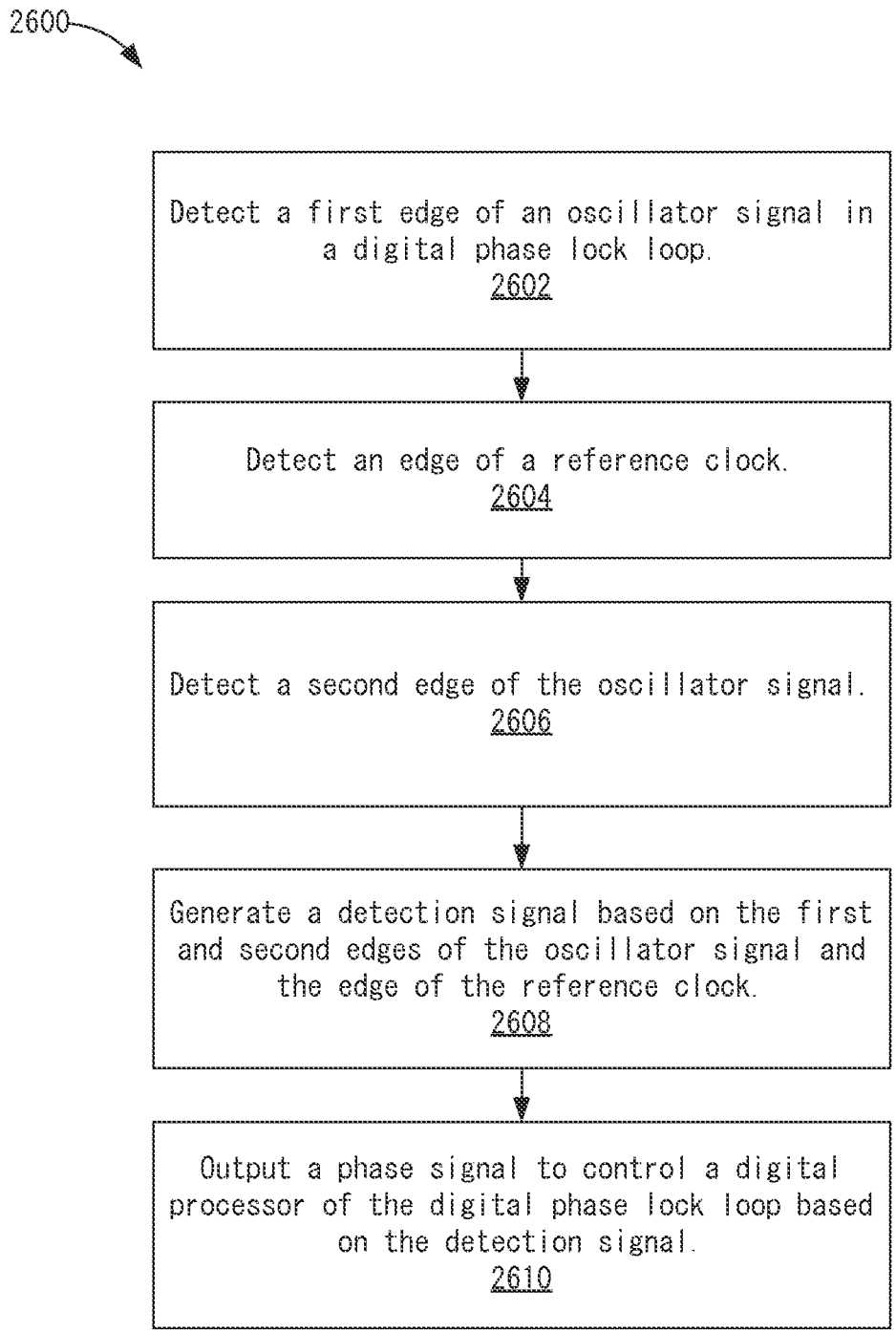
FIG. 26 illustrates a simplified flowchart of a method for generating skew correction according to one embodiment.

FIG. 26 illustrates a simplified flowchart of a method for generating skew correction in RF counter 110 according to one embodiment. At 2602, a first edge of the OSC signal in a digital phase lock loop is detected. The first edge may be a rising edge of the OSC signal. At 2604, an edge of the REF clock is detected. The type of edge of the REF clock is the same type as the first edge of the OSC signal. At 2606, a second edge of the oscillator signal is detected. The second edge of the OSC signal has a different transition type from the first edge of the OSC signal. If the first edge is a rising edge, the second edge is a falling edge. At 2608, a detection signal (e.g., estimator output E) indicative of the edge of the REF clock being near the first edge of the OSC signal is determined based on the first and second edges of the OSC signal and the edge of the REF clock. At 2610, a phase signal is outputted to control digital processor 102 based on the detection signal.

Particular embodiments provide many advantages. For example, the detection and correction of the skew may provide a more accurate time detection that can be used to adjust the oscillator output frequency.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. A method comprising:
   detecting a first edge of an oscillator signal in a digital phase lock loop;
   detecting an edge of a reference clock;
   detecting a second edge of the oscillator signal, the second edge of the oscillator signal having a different transition type from the first edge of the oscillator signal;
   generating a detection signal indicative of the edge of the reference clock being near the first edge of the oscillator signal, based on the first and second edges of the oscillator signal and the edge of the reference clock;
   detecting a fractional phase of a time to digital convertor of the digital phase lock loop based on the edge of the reference clock and the first edge of the oscillator signal;
   adding a correction to a phase signal based on the detected fractional phase and the detection signal; and
   outputting the phase signal to control a digital processor.

2. The method of claim 1, wherein the first edge of the oscillator signal and the edge of the reference clock are rising transitions.

3. The method of claim 1, wherein the first edge of the oscillator signal and the edge of the reference clock are falling transitions.

4. The circuit of claim 1, wherein the detection signal has a first value if the edge of a reference clock is detected before the first edge of an oscillator signal, and the detection signal has a second value if the edge of a reference clock is not detected before the first edge of an oscillator.

5. The method of claim 1, wherein the adding a correction to the phase signal further comprises:
determining when a difference between the fractional phase and a maximum fractional phase is not within a first threshold value, and the difference between the fractional phase and a minimum fractional phase is not within the first threshold value, and
in response to the determining, determining that a value of the correction is to be zero.

6. The method of claim 1, wherein the adding a correction to the phase signal further comprises:
determining an expected phase based on the detection signal;
comparing the difference between the fractional phase and the expected phase to a second threshold value; and
determining a correction to the phase signal based on the comparison.

7. The method of claim 6, wherein the determining a correction further comprises;
determining when the difference is less than the second threshold value; and
in response to determining that the difference is less than the second threshold, determining a value of the correction is to be zero.

8. The method of claim 6, wherein the determining a correction further comprises;
determining when the difference is not less than the second threshold value; and
in response to determining that the difference is not less than the second threshold value, determining a value of the correction based on the expected phase.

9. The method of claim 1, wherein the adding a correction to the phase signal further comprises:
determining when a difference between the fractional phase and a maximum fractional phase is not within a first threshold value, and the difference between the fractional phase and a minimum fractional phase is not within the first threshold value; and
generate, in response to the determination, using a backup circuitry, a correction based on the fractional phase.

10. A circuit comprising:
circuitry configured to:
detect a first edge of an oscillator signal in a digital phase lock loop;
detect an edge of a reference clock;
detect a second edge of the oscillator signal, the second edge of the oscillator signal having a different transition type from the first edge of the oscillator signal;
generate a detection signal indicative of the edge of the reference clock being near the first edge of the oscillator signal, based on the first and second edges of the oscillator signal and the edge of the reference clock;
detect a fractional phase of a time to digital convertor of the digital phase lock loop based on the edge of the reference clock and the first edge of the oscillator signal;
add a correction to a phase signal based on the detected fractional phase and the detection signal; and
output the phase signal to control a digital processor of the digital phase lock loop based on the detection signal.

11. The circuit of claim 10, wherein the first edge of the oscillator signal and the edge of the reference clock are both rising transitions.

12. The circuit of claim 10, wherein the first edge of the oscillator signal and the edge of the reference clock are both falling transitions.

13. The circuit of claim 10, wherein the detection signal has a first value if the edge of a reference clock is detected before the first edge of an oscillator signal, and the detection signal has a second value if the edge of a reference clock is not detected before the first edge of an oscillator.

14. The circuit of claim 10, wherein the circuitry, when adding a correction to the phase signal, is further configured to:
determine when a difference between the fractional phase and a maximum fractional phase is not within a first threshold value, and the difference between the fractional phase and a minimum fractional phase is not within the first threshold value, and
in response to the determining, determine that a value of the correction is to be zero.

15. The circuit of claim 10, wherein the circuitry, when adding a correction to the phase signal, is further configured to:
determine an expected phase based on the detection signal;
compare the difference between the fractional phase and the expected phase to a second threshold value; and
determine a correction to the phase signal based on the comparison.

16. The circuit of claim 15, wherein the circuitry, when determining a correction, is further configured to:
determine when the difference is less than the second threshold value; and
in response to determining that the difference is less than the second threshold, determine a value of the correction is to be zero.

17. The circuit of claim 15, wherein the circuitry, when determining a correction, is further configured to:
determine when the difference is not less than the second threshold value; and
in response to determining that the difference is not less than the second threshold value, determine a value of the correction based on the expected phase.

18. The circuit of claim 15, wherein the circuitry, when adding a correction to the phase signal, is further configured to:
determine when a difference between the fractional phase and a maximum fractional phase is not within a first threshold value, and the difference between the fractional phase and a minimum fractional phase is not within the first threshold value; and
generate, in response to the determination, using a backup circuitry, a correction based on the fractional phase.

* * * * *